(12) United States Patent
Adachi et al.

(10) Patent No.: US 9,634,176 B2
(45) Date of Patent: Apr. 25, 2017

(54) METHOD FOR MANUFACTURING CRYSTALLINE SILICON-BASED SOLAR CELL AND METHOD FOR MANUFACTURING CRYSTALLINE SILICON-BASED SOLAR CELL MODULE

(71) Applicant: KANEKA CORPORATION, Osaka-shi, Osaka (JP)

(72) Inventors: Daisuke Adachi, Settsu (JP); Masanori Kanematsu, Settsu (JP); Hisashi Uzu, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/893,716

(22) PCT Filed: Apr. 1, 2014

(86) PCT No.: PCT/JP2014/059689
§ 371 (c)(1),
(2) Date: Nov. 24, 2015

(87) PCT Pub. No.: WO2014/192408
PCT Pub. Date: Dec. 4, 2014

(65) Prior Publication Data
US 2016/0133779 A1    May 12, 2016

(30) Foreign Application Priority Data
May 29, 2013 (JP) .................................. 2013-113526

(51) Int. Cl.
H01L 31/18 (2006.01)
H01L 31/0747 (2012.01)
(Continued)

(52) U.S. Cl.
CPC .... H01L 31/1804 (2013.01); H01L 31/02168 (2013.01); H01L 31/022425 (2013.01);
(Continued)

(58) Field of Classification Search
CPC ............... H01L 31/1804; H01L 31/048; H01L 31/0445; H01L 31/1884; H01L 31/186;
(Continued)

(56) References Cited

U.S. PATENT DOCUMENTS

| 4,586,988 A | 5/1986 | Nath et al. |
| 4,989,059 A | 1/1991 | Micheels et al. |

(Continued)

FOREIGN PATENT DOCUMENTS

| JP | S6066426 A | 4/1985 |
| JP | H09129904 A | 5/1997 |

(Continued)

OTHER PUBLICATIONS

Adachi, D., "Hetero Setsugo Taiyo Denchi no Saikin no Shinten," Hakumaku Taiyo Denchi Seminar, vol. 4, Oct. 18, 2012, 11 pages. (See NPL 2, International Search Report Issued in Application No. PCT/JP2014/059689 for Explanation of Relevance).
(Continued)

*Primary Examiner* — Jerome Jackson, Jr.
*Assistant Examiner* — Bo Fan
(74) *Attorney, Agent, or Firm* — Alleman Hall McCoy Russell & Tuttle LLP

(57) ABSTRACT

A method for manufacturing a crystalline silicon-based solar cell having a photoelectric conversion section includes a silicon-based layer of an opposite conductivity-type on a first principal surface side of a crystalline silicon substrate of a first conductivity-type, and a collecting electrode formed by an electroplating method on a first principal surface of the photoelectric conversion section. By applying laser light
(Continued)

from a first or second principal surface side of the photoelectric conversion section, an insulation-processed region his formed where a short-circuit between the first principal surface and a second principal surface of the photoelectric conversion section is eliminated. On the collecting electrode and/or the insulation-processed region, a protecting layer s formed for preventing diffusion of a metal contained in the collecting electrode into the substrate. After the protecting layer is formed, the insulation-processed region is heated to eliminate leakage between the substrate and the silicon-based layer.

15 Claims, 8 Drawing Sheets

(51) Int. Cl.
| | |
|---|---|
| *H01L 31/0216* | (2014.01) |
| *H01L 31/0224* | (2006.01) |
| *H01L 31/0445* | (2014.01) |
| *H01L 31/048* | (2014.01) |

(52) U.S. Cl.
CPC .... *H01L 31/022466* (2013.01); *H01L 31/048* (2013.01); *H01L 31/0445* (2014.12); *H01L 31/0747* (2013.01); *H01L 31/186* (2013.01); *H01L 31/1884* (2013.01); *Y02E 10/547* (2013.01); *Y02P 70/521* (2015.11)

(58) Field of Classification Search
CPC ..... H01L 31/022466; H01L 31/022425; H01L 31/02168; H01L 31/0747; Y02E 10/547; Y02P 70/521
USPC ...................................... 438/64, 98; 136/256
See application file for complete search history.

(56) References Cited

U.S. PATENT DOCUMENTS

| | | | |
|---|---|---|---|
| 5,935,344 A | 8/1999 | Endo et al. | |
| 6,271,053 B1 | 8/2001 | Kondo | |
| 2006/0219292 A1 | 10/2006 | Asaumi et al. | |
| 2010/0006141 A1* | 1/2010 | Oikawa | B32B 5/26 136/251 |
| 2011/0315190 A1* | 12/2011 | Yoshikawa | H01L 31/0465 136/244 |
| 2012/0240998 A1 | 9/2012 | Ballif | |
| 2012/0291844 A1* | 11/2012 | Tsuge | H01L 31/022425 136/244 |
| 2013/0312827 A1* | 11/2013 | Adachi | H01L 31/022425 136/256 |
| 2015/0075601 A1 | 3/2015 | Adachi et al. | |

FOREIGN PATENT DOCUMENTS

| | | |
|---|---|---|
| JP | 2000058885 A | 2/2000 |
| JP | 2000340814 A | 12/2000 |
| JP | 2006310774 A | 11/2006 |
| JP | 2011199045 A | 10/2011 |
| JP | 2013507781 A | 3/2013 |
| JP | 5374779 B1 | 12/2013 |
| WO | 2011045287 A1 | 4/2011 |
| WO | 2013161127 A1 | 10/2013 |

OTHER PUBLICATIONS

ISA Japanese Patent Office, International Search Report Issued in Application No. PCT/JP2014/059689, Jun. 17, 2014, WIPO, 4 pages.

* cited by examiner

C1

D1

C2

D2

C3

D3

C4

D4

C5

D5

5A

5B

5C

METHOD FOR MANUFACTURING CRYSTALLINE SILICON-BASED SOLAR CELL AND METHOD FOR MANUFACTURING CRYSTALLINE SILICON-BASED SOLAR CELL MODULE

TECHNICAL FIELD

The present invention relates to a method for manufacturing a crystalline silicon-based solar cell using a crystalline silicon substrate, and a method for manufacturing a crystalline silicon-based solar cell module.

BACKGROUND ART

Since energy issues and global environmental issues are becoming more serious, solar cells are receiving more attention as an alternative energy for replacing fossil fuels. In a solar cell, carriers (electrons and holes) generated by light irradiation to a photoelectric conversion section composed of a semiconductor junction or the like are extracted to an external circuit to generate electricity.

Crystalline silicon-based solar cells using a single-crystalline silicon substrate or a polycrystalline silicon substrate are receiving more attention as solar cells with high conversion efficiency. In one form of the crystalline silicon-based solar cell, a photoelectric conversion section including a semiconductor junction is formed by diffusing conductive impurities such as phosphorus atoms to the light-receiving side of a crystalline silicon substrate of a first conductivity-type (p-type) to form a silicon layer of an opposite conductivity-type (n-type) (hereinafter, such a form may be referred to as a "pn-junction crystalline silicon-based solar cell").

As one form of the crystalline silicon-based solar cell, a solar cell with a semiconductor junction formed by forming an amorphous silicon-based thin-film on a surface of a crystalline silicon substrate is also known. In such a crystalline silicon-based solar cell including an amorphous silicon-based thin-film, the photoelectric conversion section includes an amorphous silicon-based thin-film of an opposite conductivity-type (p-type or n-type) and a transparent electrode layer on the light-receiving side of the crystalline silicon substrate of a first conductivity-type (n-type or p-type), and an amorphous silicon-based thin-film of the first conductivity-type and a transparent electrode layer on the back side of the crystalline silicon substrate (hereinafter, such a form may be referred to as a "heterojunction solar cell").

In these crystalline silicon-based solar cells, metal collecting electrodes are provided on a light-receiving surface side of the photoelectric conversion section for efficiently collecting carriers generated at the photoelectric conversion section to the external circuit. The collecting electrode of the solar cell is generally formed by pattern-printing a silver paste by a screen printing method. This method is simple in terms of the process itself, but has such a problem that the material cost of silver is high, and the resistivity of the collecting electrode increases when a silver paste material containing a resin is used. For decreasing the resistivity of the collecting electrode formed of a silver paste, it is necessary to thickly print the silver paste. However, since the line width of the electrode increases with the increase of the print thickness, thinning of the electrode is difficult, and the shading loss by the collecting electrode increases.

For solving these problems, a method is known in which a collecting electrode is formed by a plating method excellent in terms of material and process costs. For example, Patent Documents 1 and 2 disclose a formation method in which a metal layer made of copper or the like is formed by a plating method on a transparent electrode that forms a photoelectric conversion section. In this method, first, a resist material layer (insulating layer) having an opening section matching the shape of a collecting electrode is formed on the transparent electrode layer of the photoelectric conversion section, and a metal layer is formed at the resist opening section of the transparent electrode layer by electroplating. Thereafter, the resist is removed to form a collecting electrode having a predetermined shape.

Patent Document 3 discloses a method in which an insulating layer of $SiO_2$ or the like is provided on a transparent electrode, a groove extending through the insulating layer is then provided to expose the surface or side surface of the transparent electrode layer, and a metal collecting electrode is formed so as to be in conduction with an exposed area of the transparent electrode. Specifically, a method is proposed in which a metal seed is formed on the exposed area of the transparent electrode layer by a light-induced plating method or the like, and a metal electrode is formed by electroplating with the metal seed as an origination point.

Patent Document 4 proposes a method in which a discontinuous insulating layer having an opening is formed on an electroconductive seed including metal particles, and a metal electrode is formed via the opening of the insulating layer by electroplating.

The crystalline silicon-based solar cell is known to have the problem of leakage due to a short-circuit between the light-receiving side and the back side of the crystalline silicon substrate. For example, the pn-junction crystalline silicon-based solar cell has the problem that in formation of a silicon layer of an opposite conductivity-type (e.g., n-type) on a surface of a crystalline silicon substrate of a first conductivity-type (e.g., p-type) on the light-receiving side, conductive impurities such as phosphorus atoms diffuse to the side surface and the back side of the crystalline silicon substrate, leading to a short-circuit between the light-receiving side and the back side. The heterojunction solar cell has the problem that in formation of thin-films such as an amorphous silicon layer and a transparent electrode layer on a crystalline silicon substrate by a plasma-enhanced chemical vapor deposition (CVD) method, a sputtering method or the like, the thin-films are not only formed on a principal forming surface of the silicon substrate, but also formed so as to wrap around to the side surface or the vicinity of the peripheral end of a principal surface on a side opposite to the principal forming surface, resulting in occurrence of a short-circuit between electrodes on the surface and the back surface and between amorphous silicon layers.

For eliminating such a short-circuit between the front and the back surfaces of the crystalline silicon substrate, a method has been proposed in which an insulation process is performed by laser processing. For example, Patent Document 5 discloses a method in which a silicon layer of an opposite conductivity-type is formed on the light-receiving side of a crystalline silicon substrate of a first conductivity-type, and an end of the crystalline silicon substrate on the back side is subjected to laser processing to form a groove, so that the silicon layer of the opposite conductivity-type is removed. Patent Document 6 discloses a method in which a groove is formed by laser processing to remove a conductive silicon-based thin-film and a transparent electrode layer formed on a surface of a crystalline silicon substrate, so that a short-circuit between the front and the back surfaces is eliminated.

Patent Document 6 illustrates removal of the transparent electrode layer and the conductive semiconductor layer by applying laser light, but it is difficult to selectively remove these layers by applying laser light. Thus, a groove formed by laser processing generally extends to a surface or the inside of a crystalline silicon substrate. Patent Document 7 indicates the problem that when laser processing is performed from the side of a surface which is provided with a semiconductor layer of the opposite conductivity-type, a silicon substrate-exposed area such as a groove formed by laser processing, an end surface or the like becomes an additional leak spot, leading to a reduction in open circuit voltage and fill factor. In view of the problem, Patent Document 7 proposes a method in which a groove is formed by laser processing from the side of a surface which is provided with a semiconductor layer of the first conductivity-type having a conductivity type identical to that of a silicon substrate of the first conductivity-type, and the silicon substrate is then cleaved with the groove as an origination point.

Patent Document 8 proposes a method in which, for integration of a thin-film silicon-based solar cell, a groove for removing a back electrode layer is formed by laser processing to insulate adjacent cells from each other, and the processed portion is heated to perform insulation although the method is not related to a crystalline silicon-based solar cell. According to this method, a leak spot generated due to laser processing is insulated, and therefore a leakage current is reduced, so that the fill factor of an integrated thin-film solar cell can be improved.

PRIOR ART DOCUMENTS

Patent Documents

Patent Document 1: JP-60-66426
Patent Document 2: JP-A-2000-58885
Patent Document 3: JP-A-2011-199045
Patent Document 4: WO2011/045287
Patent Document 5: U.S. Pat. No. 4,989,059
Patent Document 6: JP-9-129904
Patent Document 7: JP-A-2006-310774
Patent Document 8: JP-A-2000-340814

SUMMARY OF THE INVENTION

Problems to be Solved by the Invention

It is considered that in a crystalline silicon-based solar cell, leakage can also be suppressed by performing an insulation process by laser processing, followed by subjecting the laser-processed portion (the exposed area of the silicon substrate) to a heating treatment as described in Patent Document 8. However, studies by the inventors have shown that in a crystalline silicon-based solar cell in which a collecting electrode composed of a metal such as copper is formed by a plating method, when a short-circuit between the front and the back surfaces is eliminated by laser processing, and a heating treatment is performed for reducing leakage caused by laser processing, conversion characteristics deteriorate.

In view of the above-mentioned problems, an object of the present invention is to provide a crystalline silicon-based solar cell in which a metal collecting electrode is formed by an electroplating method, and a short-circuit between the front and the back surfaces of a crystalline silicon substrate, and leakage are suppressed.

Means for Solving the Problems

The inventors have conducted studies on factors of deterioration of conversion characteristics when a heating treatment is performed for reducing leakage caused by laser processing in a crystalline silicon-based solar cell, and resultantly the inventors have presumed that one factor is diffusion of a metal such as copper into a crystalline silicon substrate from an exposed area of the crystalline silicon substrate (an insulation-processed region such as a groove, a cut surface, and the like that are formed by laser processing).

As a result of further conducting studies based on the above-mentioned presumed factor, it has been found that when a protecting layer for preventing diffusion of a metal is formed on a surface of a metal collecting electrode and/or an insulation-processed region before a heating treatment is performed for reducing leakage, deterioration of conversion characteristics can be suppressed. Thus, the present invention has been devised.

The present invention relates to a method for manufacturing a crystalline silicon-based solar cell. The crystalline silicon-based solar cell comprises: a photoelectric conversion section including a crystalline silicon substrate of a first conductivity-type having a first principal surface and a second principal surface, and a silicon-based layer of an opposite conductivity-type on the first principal surface side of the crystalline silicon substrate of the first conductivity-type; and a collecting electrode formed on the first principal surface of the photoelectric conversion section.

The crystalline silicon-based solar cell of the present invention is, for example, a heterojunction solar cell. A photoelectric conversion section of the heterojunction solar cell includes a silicon-based thin-film of the opposite conductivity-type as the silicon-based layer of the opposite conductivity-type on the first principal surface side of the crystalline silicon substrate, and a first transparent electrode layer on the silicon-based thin-film of the opposite conductivity-type. The heterojunction solar cell also includes a silicon-based thin-film of the first conductivity-type on the second principal surface side of the crystalline silicon substrate of the first conductivity-type, and a second transparent electrode layer on the silicon-based thin-film of the first conductivity-type.

The manufacturing method of the present invention includes a step of providing the photoelectric conversion section (photoelectric conversion section providing step); a step of forming the collecting electrode on the first principal surface of the photoelectric conversion section by an electroplating method (collecting electrode forming step); a step of applying laser light to the crystalline silicon substrate of the first conductivity-type in the photoelectric conversion section to form an insulation-processed region where a short-circuit between the first principal surface and the second principal surface of the photoelectric conversion section is eliminated (insulation process step); a step of forming on the collecting electrode and/or on the insulation-processed region a protecting layer for preventing diffusion of a metal, which is contained in the collecting electrode, into the crystalline silicon substrate of the first conductivity-type (protecting layer forming); and a step of heating the insulation-processed region to eliminate leakage between the crystalline silicon substrate of the first conductivity-type and the silicon-based layer of the opposite conductivity-type, which occurs in the insulation process step (heating treatment step). A heating temperature in the heating treatment step is, for example, 150 to 250° C.

In the collecting electrode forming step, it is preferred that the collecting electrode including copper is formed by the electroplating method. In the insulation process step, laser light is applied from the first principal surface side or the second principal surface side, so that the silicon-based layer of the opposite conductivity-type and the crystalline silicon substrate of the first conductivity-type in the photoelectric conversion section are removed to form a groove or a cut surface. Preferably, laser light is applied from the first principal surface side.

In the manufacturing method of the present invention, a heating treatment for eliminating leakage at the insulation-processed region is performed after the protecting layer forming step. At the time when the heating treatment is performed, diffusion of a metal (plating metal such as copper) of the collecting electrode into the silicon substrate from the insulation-processed region (exposed area of the silicon substrate) is suppressed because a protecting layer for preventing diffusion of the metal contained in the collecting electrode is formed on the collecting electrode and/or the insulation-processed region.

In the first embodiment of the manufacturing method of the present invention, the protecting layer is formed on the collecting electrode. In the first embodiment, the insulation process and the formation of the protecting layer on the collecting electrode are performed after the formation of the collecting electrode on the photoelectric conversion section. Thereafter, the heating treatment is performed. The insulation process may be performed at any of before and after the formation of the protecting layer.

In the first embodiment of the manufacturing method of the present invention, formation of the metal seed on the first principal surface of the photoelectric conversion section (metal seed forming step) may be performed before the collecting electrode forming step. In this case, the collecting electrode is formed on the metal seed by the electroplating method in the collecting electrode forming step.

The protecting layer on the collecting electrode may be an electroconductive material or an insulating material. Preferably, the protecting layer to be formed on the collecting electrode is made of an electroconductive material for making it easy to electrically connect the collecting electrode and the interconnector at the time when a plurality of solar cells are connected through the interconnector to be modularized. On the other hand, when the protecting layer on the collecting electrode layer is made of an insulating material, diffusion of a plating metal (e.g., copper) into the silicon substrate from the insulation-processed region can be further suppressed by forming the protecting layer on the insulation-processed region as well.

In the second embodiment of the manufacturing method of the present invention, the protecting layer is formed on the insulation-processed region after the insulation process step. In this case, by forming the insulating protecting layer on the insulation-processed region, leakage at the insulation-processed region is inhibited, and diffusion of the plating metal into the silicon substrate from the insulation-processed region can be suppressed.

In the second embodiment of the manufacturing method of the present invention, the collecting electrode forming step, the insulation process step, the protecting layer forming step, and the heating treatment step are performed, for example, in this order. The collecting electrode forming step may be performed after the protecting layer forming step.

In the second embodiment of the manufacturing method of the present invention, before the collecting electrode forming step, a step of forming a metal seed on the first principal surface of the photoelectric conversion section (metal seed forming step) may be performed, followed by forming the collecting electrode on the metal seed by the electroplating method. Preferably, the metal seed is selectively formed on the collecting electrode-formed region.

For example, by applying an electroconductive paste material, the metal seed can be selectively formed on the collecting electrode-formed region. Heating for curing the electroconductive paste material may also serve as the heating treatment for eliminating leakage between the crystalline silicon substrate of the first conductivity-type and the silicon-based layer of the opposite conductivity-type in the insulation-processed region.

In one aspect of the second embodiment of the manufacturing method of the present invention, a protecting layer is formed on the insulation-processed region after the metal seed is formed. At this time, the protecting layer is formed on the metal seed as well. Thereafter, the collecting electrode is formed by the electroplating method using as an origination point an opening section of the protecting layer on the metal seed. For example, when the metal seed containing a low-melting-point material is formed in the metal seed forming step, an opening section can be formed on the protective layer on the metal seed by performing heating (annealing) so as to cause the low-melting-point material in the metal seed to be thermally-fluidized after the protecting layer forming step and before the collecting electrode forming step. Annealing for forming an opening section in the protecting layer on the metal seed may also serve as a heating treatment for eliminating leakage between the crystalline silicon substrate of the first conductivity-type and the silicon-based layer of the opposite conductivity-type in the insulation-processed region.

Further, the present invention relates to a method of manufacturing a crystalline silicon-based solar cell module by electrically connecting a plurality of crystalline silicon-based solar cells each manufactured by the above-mentioned method. In the modularization of the crystalline silicon-based solar cell, the crystalline silicon-based solar cells are electrically connected to form a solar cell string. The solar cell string is sealed by a sealing material and a glass plate to obtain a solar cell module.

Effects of the Invention

According to the present invention, by laser processing, an insulation-processed region is formed where a short-circuit between the first principal surface and the second principal surface of the photoelectric conversion section is eliminated, and leakage is reduced by heating the insulation-processed region. Therefore, a crystalline silicon-based solar cell with improved conversion efficiency (especially in fill factor) may be obtained. In addition, the present invention is advantageous in terms of material and process costs, since the metal collecting electrode is formed by an electroplating method. A collecting electrode formed by the electroplating method has lower resistivity than a collecting electrode using electroconductive paste material, and can therefore contribute to improving the fill factor of the solar cell.

Further, in the present invention, a protecting layer for preventing diffusion of a metal is formed on a surface of the metal collecting electrode and/or on the insulation-processed region before the heating treatment of the insulation-processed region formed by laser processing is performed. Thus, diffusion of a metal into the crystalline silicon substrate is suppressed, so that deterioration of conversion characteristics by the heating treatment is suppressed.

According to the manufacturing method of the present invention, a crystalline silicon-based solar cell having high efficiency can be provided inexpensively.

DESCRIPTION OF EMBODIMENTS

Figure 1:
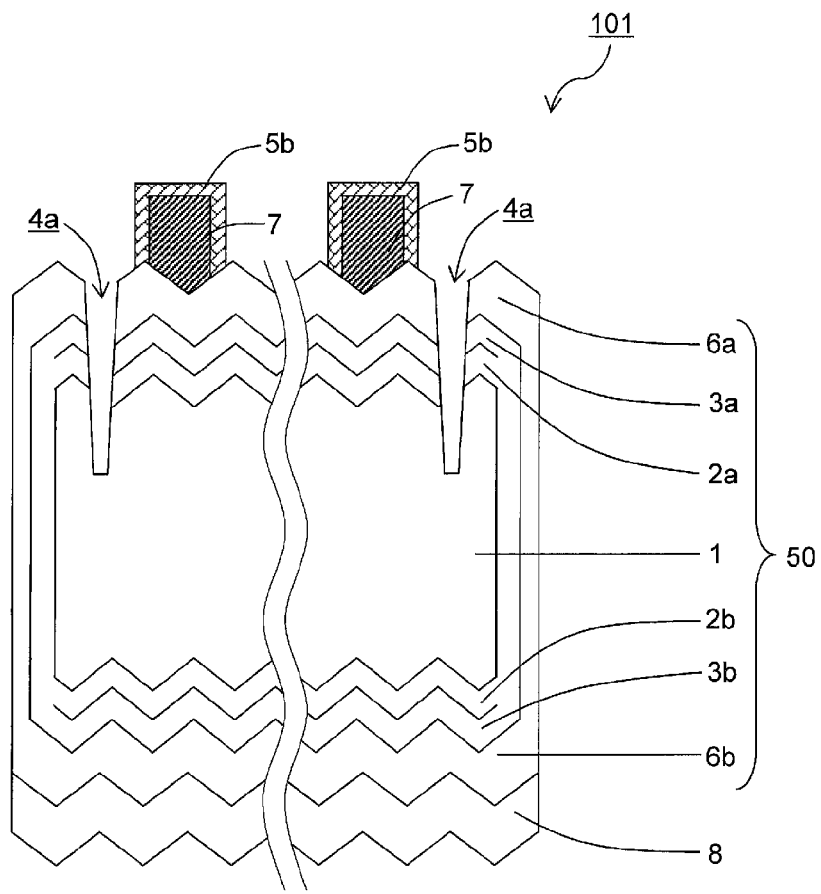
FIG. 1 is a schematic sectional view showing a heterojunction solar cell according to one embodiment.

The invention relates to a method for manufacturing a crystalline silicon-based solar cell having a collecting electrode on a photoelectric conversion section. The photoelectric conversion section has a silicon-based layer of an opposite conductivity-type formed on a first principal surface of a crystalline silicon substrate of a first conductivity-type which has the first principal surface as a light-receiving surface and a second principal surface as a back surface. The collecting electrode is formed on the first principal surface of the photoelectric conversion section by an electroplating method.

In the manufacturing method of the present invention, laser light is applied from the first principal surface side or the second principal surface side of the photoelectric conversion section to the crystalline silicon substrate of the first conductivity-type to form an insulation-processed region where a short-circuit between the first principal surface and the second principal surface of the photoelectric conversion section is eliminated. In a heterojunction solar cell, an insulation-processed region is formed so as to eliminate a short-circuit between a transparent electrode layer on the first principal surface (light-receiving surface) side and a transparent electrode layer on the second principal surface (back surface) side and a short-circuit between a silicon-based thin-film of an opposite conductivity-type on the first principal surface side and a silicon-based thin-film of the first conductivity-type on the second principal surface side. In a pn-junction crystalline silicon-based solar cell, an insulation-processed region is formed so as to eliminate a short-circuit between a silicon-based layer of an opposite conductivity-type on the first principal surface side and a silicon-based thin-film of a first conductivity-type on the second principal surface side.

Further, in the manufacturing method of the present invention, a protecting layer for preventing diffusion of a metal is formed. In the first embodiment of the present invention, the protecting layer for preventing diffusion of the metal is formed on the collecting electrode. In the second embodiment of the present invention, an insulating material layer as the protecting layer for preventing diffusion of the metal is formed on the insulation-processed region.

Further, in the manufacturing method of the present invention, the insulation-processed region formed by applying laser light is heated to eliminate leakage between the crystalline silicon substrate of the first conductivity-type and the silicon-based layer of the opposite conductivity-type, which occurs in the insulation process step. Leakage is eliminated by the heating treatment after formation of the protecting layer in both of the first embodiment in which the protecting layer is formed on the collecting electrode and the second embodiment in which the protecting layer is formed on the insulation-processed region.

The present invention will be described more in detail below with focus on an example of a heterojunction solar cell. The heterojunction solar cell is a crystalline silicon-based solar cell in which silicon-based thin-films of p-type and n-type are formed on surfaces of a single-crystalline silicon substrate of a first conductivity-type (p-type or n-type) to produce a diffusion potential. Above all, a heterojunction solar cell having thin intrinsic amorphous silicon layers interposed between the conductive silicon-based thin-films (p-type and n-type) and the crystalline silicon substrate is known as one configuration of a crystalline silicon-based solar cell with the highest conversion efficiency.

First Embodiment

FIG. 1 is a schematic sectional view showing an example of a heterojunction solar cell according to the first embodiment, in which a protecting layer is provided on a collecting electrode. The heterojunction solar cell 101 of FIG. 1 includes a collecting electrode 7 on a light-receiving side transparent electrode layer 6a of a photoelectric conversion section 50, and the collecting electrode 7 is covered by the protecting layer 5b. An insulation-processed region 4a is formed on the photoelectric conversion section 50.

<Configuration of Photoelectric Conversion Section]

On one surface (light-receiving surface or first principal surface) of a crystalline silicon substrate 1 of a first conductivity-type, the heterojunction solar cell 101 has a silicon-based thin-film of an opposite conductivity-type 3a, which has a conductivity type different from that of the crystalline silicon substrate of the first conductivity-type, and a light-receiving side transparent electrode layer 6a in this order as the photoelectric conversion section 50. On the other surface (back surface or second principal surface) of the crystalline silicon substrate 1 of the first conductivity-type, a silicon-based thin-film of the first conductivity-type 3b, which has a conductivity type identical to that of the crystalline silicon substrate of the first conductivity-type, and a back side transparent electrode layer 6b are provided in this order.

Intrinsic silicon-based thin-films 2a and 2b are preferably provided between the crystalline silicon substrate 1 of the first conductivity-type and the conductive silicon-based thin-films 3a and 3b. A back side metal electrode 8 is preferably provided on the back side transparent electrode layer 6b.

First, the crystalline silicon substrate 1 of the first conductivity-type used in the heterojunction solar cell will be described. Generally, the crystalline silicon substrate contains impurities that supply a charge to silicon for imparting conductivity. The crystalline silicon substrate is classified as an n-type which contains atoms for introducing electrons into silicon atoms (e.g., phosphorus) or a p-type which contains atoms for introducing holes into silicon atoms (e.g., boron). That is, the "first conductivity-type" in the present invention means one of the n-type and the p-type.

In a heterojunction solar cell, electron/hole pairs can be efficiently separated and collected by setting a reverse junction as a heterojunction on the light-receiving side at which light incident to the single-crystalline silicon substrate is absorbed most, thereby providing a strong electric field. Therefore, in the heterojunction solar cell of the present invention, the conductive thin-films are formed so as to set the heterojunction on the light-receiving surface side to be a reverse junction.

When holes and electrons are compared, electrons, which are smaller in effective mass and scattering cross section, generally have greater mobility. Accordingly, it is preferred that the crystalline silicon substrate 1 of the first conductivity-type used in a heterojunction solar cell is an n-type single-crystalline silicon substrate. In order to enhance light confinement, the crystalline silicon substrate 1 of the first conductivity-type preferably has a textured structure in its surface.

A silicon-based thin-film is formed on the surface of the crystalline silicon substrate 1 of the first conductivity-type on which a textured structure is formed. The method for forming these silicon-based thin-film layers is preferably plasma-enhanced CVD. Conditions used for forming the silicon-based thin-film layers by plasma-enhanced CVD method are preferably as follows: a substrate temperature of 100 to 300° C., a pressure of 20 to 2600 Pa, and a high-frequency power density of 0.004 to 0.8 W/cm². A source gas used to form the silicon-based thin-film layers may be a silicon-containing gas such as $SiH_4$ or $Si_2H_6$, or a mixed gas of silicon-based gas and $H_2$.

The conductive silicon-based thin-films 3a and 3b are silicon-based thin-films of the first conductivity-type or the opposite conductivity-type. For example, when an n-type silicon substrate is used as the crystalline silicon substrate 1 of the first conductivity-type, the silicon-based thin-film of the first conductivity-type and the silicon-based thin-film of the opposite conductivity-type are n- and p-types, respectively. A dopant gas for forming p-type or n-type silicon-based thin-film is preferably, for example, $B_2H_6$ or $PH_3$. The amount of an impurity such as P or B added is sufficient as a trace amount; thus, it is preferred to use a mixed gas diluted with $SiH_4$ or $H_2$ beforehand. When a gas containing a different element, such as $CH_4$, $CO_2$, $NH_3$, or $GeH_4$, is added in deposition of the conductive silicon-based thin-film, the silicon-based thin-film is alloyed so that the energy gaps of the silicon-based thin-film can be changed.

Examples of the silicon-based thin-film include an amorphous silicon thin-film and microcrystalline silicon (a thin-film including amorphous silicon and crystalline silicon). Among them, an amorphous silicon-based thin-film is preferably used. When an n-type single-crystalline silicon substrate is used as the crystalline silicon substrate 1 of the first conductivity-type, examples of the preferred structure of the photoelectric conversion section 50 include a stacked structure in the order of the light-receiving side transparent electrode layer 6a/a p-type amorphous silicon-based thin-film 3a/an i-type amorphous silicon-based thin-film 2a/the n-type single-crystalline silicon substrate 1/an i-type amorphous silicon-based thin-film 2b/an n-type amorphous silicon-based thin-film 3b/a back side transparent electrode layer 6b. In this case, for the aforementioned reason, the light-receiving side is preferably on the p layer side (reverse junction side).

The intrinsic silicon-based thin-films 2a and 2b are preferably i-type hydrogenated amorphous silicon composed of silicon and hydrogen. When i-type hydrogenated amorphous silicon is formed on a single-crystalline silicon substrate by a CVD method, surface passivation can be effectively performed while suppressing diffusion of impurities to the single-crystalline silicon substrate. When the amount of hydrogen in the film is changed along the thickness direction, the layer may have an energy gap profile effective for collecting carriers.

The p-type silicon-based thin-film is preferably a p-type hydrogenated amorphous silicon layer, a p-type amorphous silicon carbide layer, or a p-type amorphous silicon oxide layer. The p-type hydrogenated amorphous silicon layer is preferable for suppressing diffusion of doping impurities and the like and reducing series resistance. On the other hand, the p-type amorphous silicon carbide layer and the p-type amorphous silicon oxide layer are wide-gap low-refractive index layers, and therefore preferable in the sense that optical loss can be reduced.

The photoelectric conversion section 50 of the heterojunction solar cell 101 preferably includes transparent electrode layers 6a and 6b on the conductive silicon-based thin-films 3a and 3b. The transparent electrode layers 6a and 6b preferably have a conductive oxide as a main component. As the conductive oxide, for example, zinc oxide, indium oxide, and tin oxide may be used alone or in a mixture thereof. From the viewpoints of electroconductivity, optical characteristics, and long-term reliability, indium-based oxides including indium oxide are preferable. Among them, those having indium tin oxide (ITO) as a main component are suitably used. The transparent electrode layer may be a single layer or a layered structure composed of multiple layers.

Here, the wording having a specific material "as a main component" in this specification means that the content is more than 50% by weight, preferably 70% by weight or more, more preferably 90% by weight or more.

A dopant can be added to the transparent electrode layer. For example, when zinc oxide is used for the transparent electrode layer, examples of the dopant include aluminum, gallium, boron, silicon, and carbon. When indium oxide is used for the transparent electrode layer, examples of the dopant include zinc, tin, titanium, tungsten, molybdenum, and silicon. When tin oxide is used for the transparent electrode layer, examples of the dopant include fluorine.

The dopant can be added to one or both of the light-receiving side transparent electrode layer 6a and the back side transparent electrode layer 6b. In particular, the dopant is preferably added to the light-receiving side transparent electrode layer 6a. By adding the dopant to the light-receiving side transparent electrode layer 6a, the transparent electrode layer itself is made less resistive, and the electric loss caused by resistance between the transparent electrode layer 6a and the collecting electrode 7 can be suppressed.

The thickness of the light-receiving side transparent electrode layer 6a is preferably set to 10 nm or more and 140 nm or less, from the viewpoints of transparency, electroconductivity, and reduction of light reflection. The role of the light-receiving side transparent electrode layer 6a is to transport carriers to the collecting electrode 7, and it suffices that the light-receiving side transparent electrode layer 6a has a level of electroconductivity required for this purpose, and the thickness thereof is preferably 10 nm or more. By ensuring that the thickness is 140 nm or less, the absorption loss at the light-receiving side transparent electrode layer 6a is kept low, so that a reduction in photoelectric conversion efficiency associated with a reduction in transmittance can be suppressed. When the thickness of the transparent electrode layer 6a falls within the aforementioned range, an increase in carrier concentration within the transparent electrode layer can also be prevented, and therefore a reduction in photoelectric conversion efficiency associated with a reduction in transmittance in an infrared range is also suppressed.

The method for forming a transparent electrode layer is not particularly limited, but a physical vapor deposition method such as a sputtering method, a chemical vapor deposition (MOCVD) method utilizing a reaction of an organic metal compound with oxygen or water, or the like is preferable. In any of the formation methods, energy from heat or plasma discharge may be utilized.

The substrate temperature during the deposition of the transparent electrode layer may be appropriately set. For example, when an amorphous silicon-based thin-film is used as a silicon-based thin-film, the substrate temperature during the deposition of the transparent electrode layer is preferably 200° C. or lower. By ensuring that the substrate temperature is 200° C. or lower, desorption of hydrogen from the amorphous silicon-based thin-film and associated generation of a dangling bond to a silicon atom can be suppressed, and as a result, conversion efficiency can be improved.

As shown in FIG. 1, a back side metal electrode 8 is preferably formed on the back side transparent electrode layer 6b. For the back side metal electrode 8, it is desirable to use a material having high electroconductivity and chemical stability. When the back side metal electrode 8 is formed on the entire surface of the back side transparent electrode layer 6b, one having a high reflectivity in a near-infrared to infrared range is preferably used for a material of the back side metal electrode. Examples of the material satisfying these characteristics include silver and aluminum.

Although an example in which the back side metal electrode 8 is formed on the entire surface of the back side transparent electrode layer 6b is shown in FIG. 1, the back side metal electrode may be formed in a pattern shape similar to the light-receiving side collecting electrode 7 or in a grid shape. The method for forming a back side metal electrode is not particularly limited, and a physical vapor deposition method such as a sputtering method or a vacuum vapor deposition method, a printing method such as screen printing, or the like is applicable.

<Collecting Electrode>

The collecting electrode 7 is formed on the first principal surface of the photoelectric conversion section 50. The collecting electrode is preferably patterned in a specific shape such as a comb-like pattern. In a heterojunction solar cell, the collecting electrode 7 is formed on the light-receiving side transparent electrode layer 6a of the photoelectric conversion section 50. In the present invention, the collecting electrode is formed by an electroplating method. The deposition rate of a metal can be increased by the electroplating method, so that the collecting electrode can be formed in a short time. In addition, a collecting electrode formed by electroplating has lower resistivity than a collecting electrode using electroconductive paste material. Therefore, collection efficiency of carriers generated in the photoelectric conversion section is increased and conversion efficiency (especially in fill factor) of the solar cell can be improved.

Examples of the metal deposited by electroplating method include copper, nickel, tin, aluminum, chromium, silver, gold, zinc, lead, palladium, tungsten, and alloys thereof. Among them, copper or an alloy including copper as a main component is preferable for the metal that forms the collecting electrode due to high deposition rate in electroplating, high electroconductivity, and low material cost.

A collecting electrode including copper as a main component can be formed by, for example, an acidic copper plating. A plating solution used for acidic copper plating contains copper ions, and a solution of a known composition, which includes copper sulfate, sulfuric acid, and water as main components, can be used. Copper can be deposited by causing a current of 0.1 to 10 $A/dm^2$ to flow into the plating solution. The suitable plating time is appropriately set according to the area of a collecting electrode, the current density, cathode current efficiency, desired thickness, and so on.

A collecting electrode can be formed by depositing a metal such as copper directly on the light-receiving side transparent electrode layer 6a by electroplating. FIG. 2A is a conceptual flow chart schematically showing, at A1 to A4, one example of steps of forming a patterned collecting electrode on the transparent electrode layer 6a by electroplating. In each of FIGS. 2A, 2B, 3A, and 3B, the illustration of the configuration of the silicon substrate 1 on the second principal surface side and the configuration in the vicinity of the peripheral end of the photoelectric conversion section is omitted.

FIG. 2A at 1 shows a photoelectric conversion section having silicon-based thin-films 2a and 3a and a light-receiving side transparent electrode layer 6a on a first principal surface of a silicon substrate. First, an insulating layer 901 having an opening section corresponding to the shape of the collecting electrode is formed on the light-receiving side transparent electrode layer 6a (FIG. 2A at A2). A resist material, for example, is used as the insulating layer 901, and the opening section corresponding to the shape of the collecting electrode is formed by photolithography. In the case as described where the insulating layer 901 having the opening section is formed on the transparent electrode layer 6a, the metal layer 72 can be selectively deposited by an electroplating method at a part (opening section) on the transparent electrode layer 6a, which is not covered with the insulating layer 901 in the collecting electrode forming step (FIG. 2A at A3). Thereafter, the insulating layer 901 is removed as necessary (FIG. 2A at A4).

The collecting electrode 7 may be composed solely of the metal layer 72 formed by electroplating (plating metal layer) or may include other metal layers. For example, a metal seed 71 may be formed on the transparent electrode layer 6a by performing the metal seed forming step before the collecting electrode forming step. By providing the metal seed 71 as an underlying layer for electroplating, contact resistance between the transparent electrode layer and the collecting electrode can be reduced to improve conversion efficiency (particularly fill factor) of the solar cell. By providing the metal seed, adhesion between the transparent electrode layer and the collecting electrode can be improved.

Figure 2:
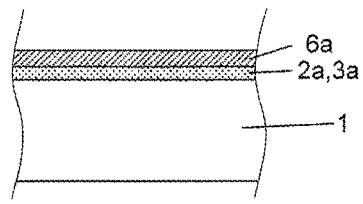
FIGS. 2A and 2B are conceptual flow charts, each schematically showing steps of forming a collecting electrode.
Figure 2:
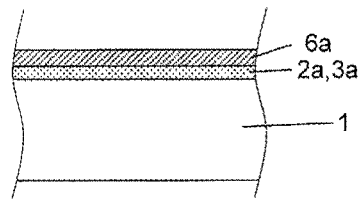
Figure 2:
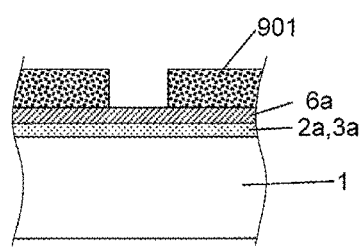
Figure 2:
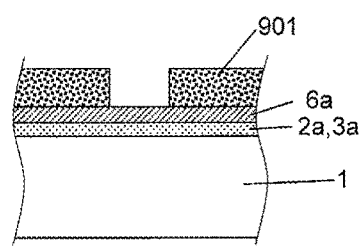
Figure 2:
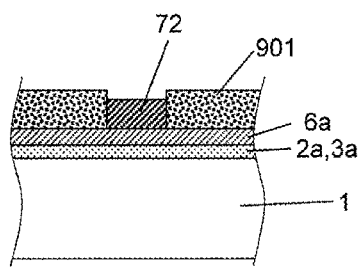
Figure 2:
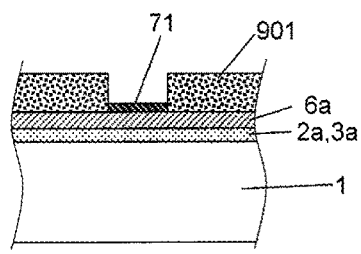
Figure 2:
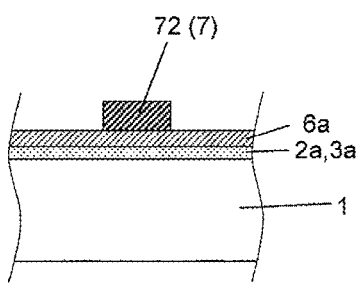
Figure 2:
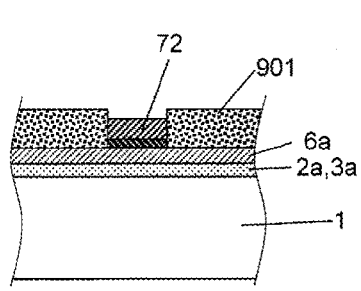
Figure 2:
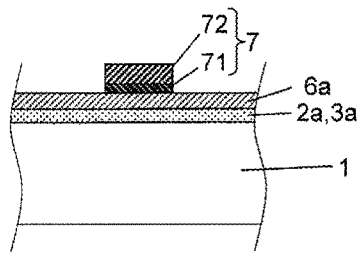
Figure 3:
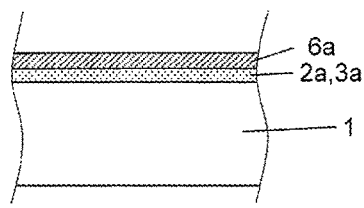
FIGS. 3A and 3B are conceptual flow charts, each schematically showing steps of forming a collecting electrode.
Figure 3:
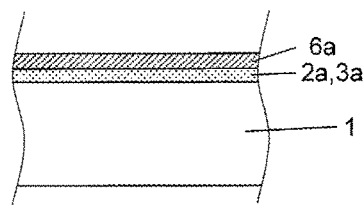
Figure 3:
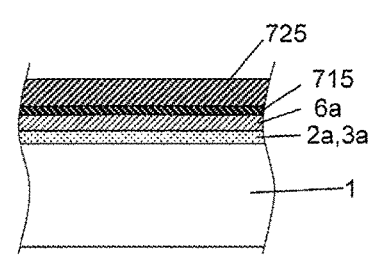
Figure 3:
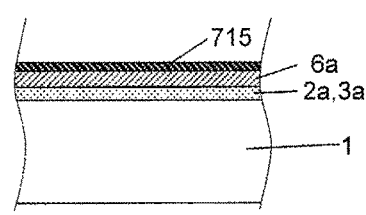
Figure 3:
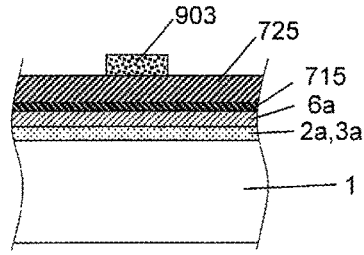
Figure 3:
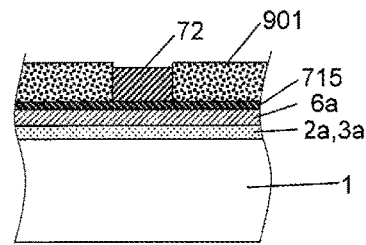
Figure 3:
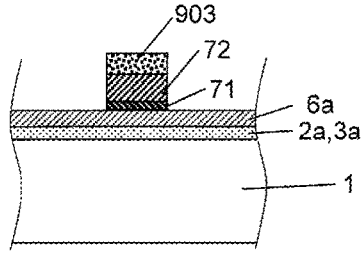
Figure 3:
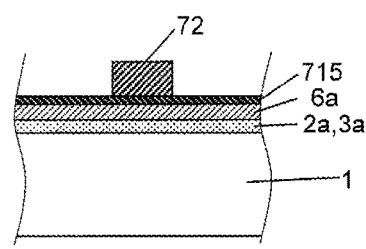
Figure 3:
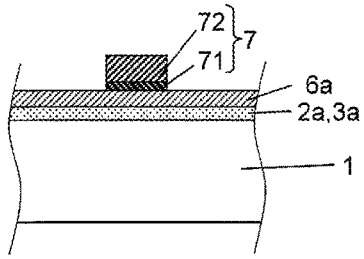
Figure 3:
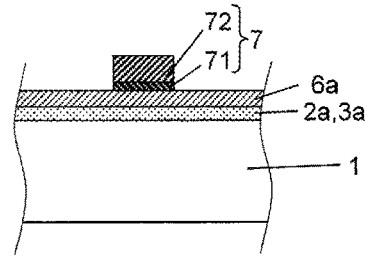
Figure 2A:
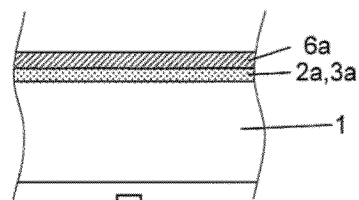
Figure 2A:
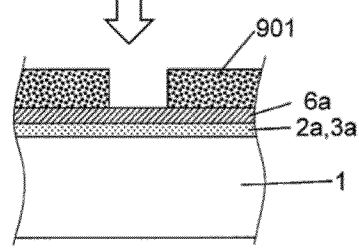
Figure 2A:
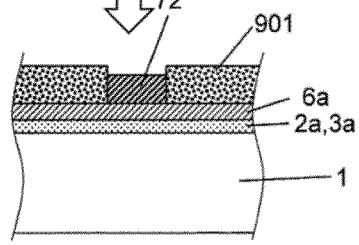
Figure 2A:
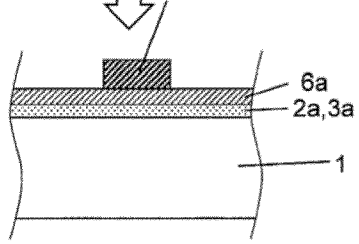
Figure 2B:
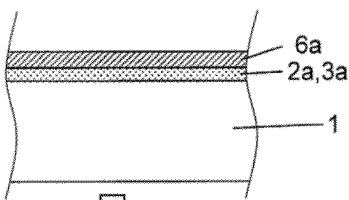
Figure 2B:
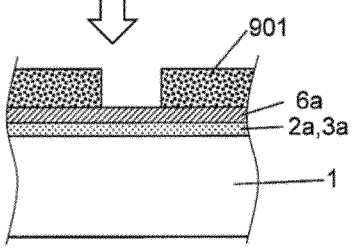
Figure 2B:
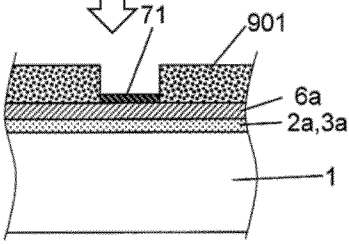
Figure 2B:
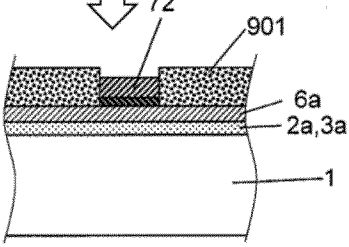
Figure 2B:
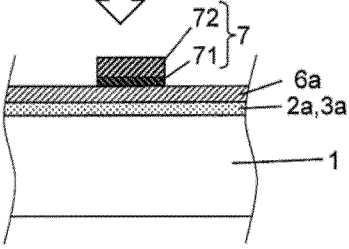

FIG. 2B is a conceptual flow chart schematically showing, at B1 to M, one example of a step of forming the collecting electrode 7 consisting of the metal seed 71 and the plating metal layer 72 by forming the metal seed 71 on the transparent electrode layer 6a in the metal seed forming step and forming the plating metal layer 72 on the metal seed 71 in the collecting electrode forming step. First, an insulating layer 901 having an opening section corresponding to the shape of the collecting electrode is formed on the light-receiving side transparent electrode layer 6a (FIG. 2B at B2). Next, in the metal seed forming step, the metal seed 71 is formed on the transparent electrode layer 6a at a part of opening section of the insulating layer 901 (FIG. 2B at B3). In the collecting electrode forming step, the metal layer 72 is deposited on the metal seed 71 by electroplating method (FIG. 2B at B4); and the insulating layer is removed thereafter (FIG. 2B at B5).

The method for forming the metal seed 71 is not particularly limited, and a dry process such as sputtering, vapor deposition, or CVD, or a wet process such as printing, or the like may be used. The metal seed may be formed by a plating method. For example, a metal seed composed of a material different from that of the metal layer 72 may be formed by an electroplating method. The metal seed may be formed by light-induced plating or electroless plating.

When a metal mainly composed of copper is deposited by electroplating as the metal layer 72, contact resistance between the transparent electrode layer 6a and the plating metal layer 72 can be reduced by forming as the metal seed 71 a metal layer mainly composed of, for example, nickel by electroless plating. As one example, the metal seed 71 composed of NiP can be formed on the transparent electrode layer 6a by keeping a plating solution, which contains sodium hypophosphite and nickel sulfate, in contact with a surface of the transparent electrode layer 6a for a predetermined time. When the metal seed is formed by electroless plating, it is preferred to perform an activation treatment before plating. For example, when a NiP metal seed is formed by electroless plating, acid activation can be performed by bringing a surface of the transparent electrode layer into contact with a catalyst solution containing palladium chloride and stannous chloride, and then with an acidic solution.

The metal seed 71 is a layer that functions as an electroconductive underlying layer when the metal layer 72 is formed by an electroplating method. Therefore, it suffices that the metal seed has such a level of electroconductivity that it can function as an underlying layer for electroplating. The thickness of the metal seed 71 is preferably 0.1 µm or more, more preferably 0.2 µm or more. On the other hand, in terms of costs, the thickness of the metal seed is preferably 5 µm or less, more preferably 3 µm or less.

The metal seed 71 shows electroconductivity, and it suffices that its volume resistivity is $10^{-2}$ Ω·cm or less. The volume resistivity of the metal seed 71 is preferably $10^{-4}$ Ω·cm or less. In this specification, seeds having a volume resistivity of $10^{-2}$ Ω·cm or less are defined as being electroconductive and seeds having a volume resistivity of $10^{2}$ Ω·cm or more are defined as insulating.

In FIGS. 2A and 2B, examples have been described in which a metal layer is deposited in an opening section of an insulating layer or a resist, etc., to form a patterned collecting electrode, but the method for forming a collecting electrode is not limited to the above-mentioned method. The patterned collecting electrode 7 may be formed by forming a metal seed layer 715 and a plating metal layer 725 on a region wider than the collecting electrode-formed region (e.g., the whole of the first principal surface of the photoelectric conversion section), and then removing the metal layer on regions other than the collecting electrode-formed region using a patterning technique such as etching.

Figure 3A:
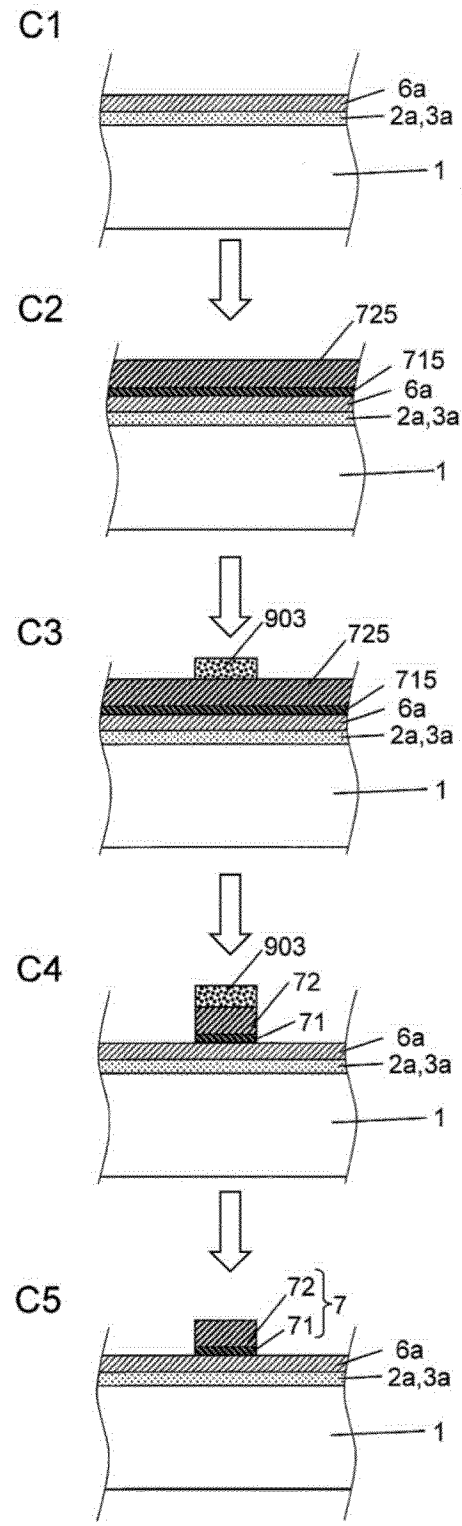

As one example, the patterned collecting electrode can be formed through the steps shown at C1 to C5 of FIG. 3A. In this example, first the metal seed layer 715 is formed on the transparent electrode layer 6a in the metal seed forming step, and the metal layer 725 is formed on the metal seed layer 715 by an electroplating method in the collecting electrode forming step (FIG. 3A at C2). At this time, the metal layer 725 may be formed directly on the transparent electrode layer 6a by the electroplating method in the collecting electrode forming step without performing the metal seed forming step.

A barrier layer 903 corresponding to the pattern shape of the collecting electrode is formed on the metal layer 725 (FIG. 3A at C3). For the barrier layer, a material (e.g., etching resist) which is excellent for adhesion with the metal layer 725 and has solvent resistance to an etchant used in the subsequent step is preferably used.

After the barrier layer 903 is formed on the metal layer 725, the metal layer 725 and the metal seed layer 715 at an area which is not covered with the barrier layer are removed to form the patterned metal layer 72 and metal seed 71 (FIG. 3A at C4). Patterning of the metal layer 725 and the metal seed layer 715 is performed by a physical treatment such as blasting or polishing, or a chemical treatment such as wet etching. Finally, the barrier layer 903 is removed to obtain the patterned collecting electrode 7 (FIG. 3A at C5).

Figure 3B:
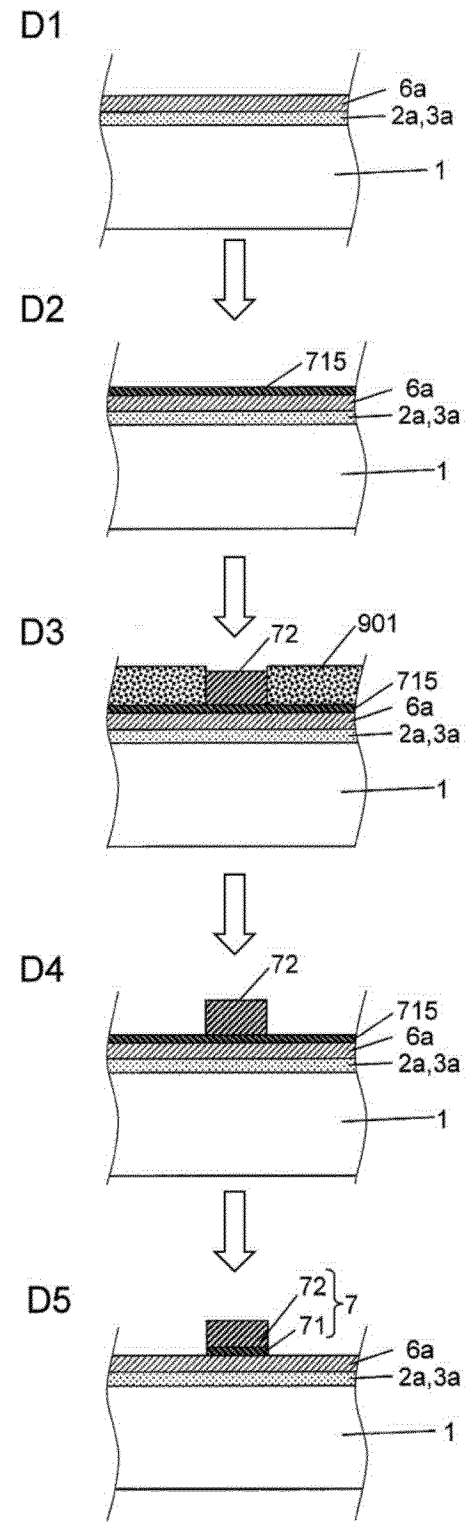
Figure 4:
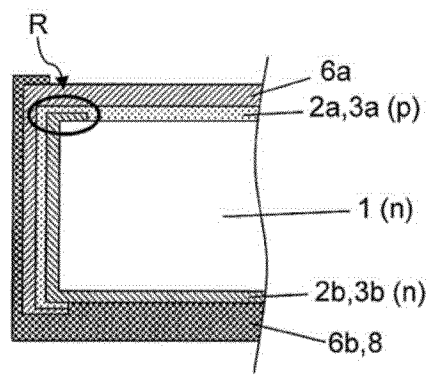

The patterned collecting electrode can also be formed through the steps shown at D1 to D5 of FIG. 3B. In this example, first the metal seed layer 715 is formed on the transparent electrode layer 6a in the metal seed forming step (FIG. 3B at D2). Next, the insulating layer 901 having an opening section corresponding to the shape of the collecting electrode is formed on the metal seed layer 715 (FIG. 3B at D3). In the collecting electrode forming step, the metal layer 72 can be deposited in the opening section of the insulating layer 901 on the metal seed layer 715 by an electroplating method (FIG. 3B at D4). Finally, the metal seed layer 715 is patterned by etching. In this way, the metal seed 71 is formed in the metal seed forming step, and the plating metal layer 72 is formed thereon in the collecting electrode forming step, so that the collecting electrode 7 consisting of the metal seed 71 and the plating metal layer 72 is formed (FIG. 3B at D5). In this embodiment, the metal layer 72 constituting most of the thickness of the collecting electrode is patterned beforehand, and therefore only the metal seed layer 715 may be patterned by etching. Thus, the etching depth and the etching time can be considerably reduced to suppress side etching during patterning.

<Insulation-Processed Region>

The insulation-processed region is a region where a short-circuit between the light-receiving surface (first principal surface) and the back surface (second principal surface) of the photoelectric conversion section is eliminated. In the embodiment shown in FIG. 1, the insulation-processed region 4a is formed in the shape of a groove that extends from the light-receiving side of the photoelectric conversion section 50 through the light-receiving side transparent electrode layer 6a, the silicon-based thin-film of the opposite conductivity-type 3a and the intrinsic silicon-based thin-film 2a to the crystalline silicon substrate 1.

Figure 4:
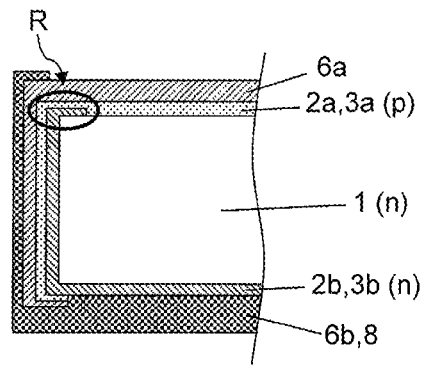
FIG. 4 is a conceptual view for explaining a short-circuit between the front and the back surfaces in a heterojunction solar cell.
Figure 5:
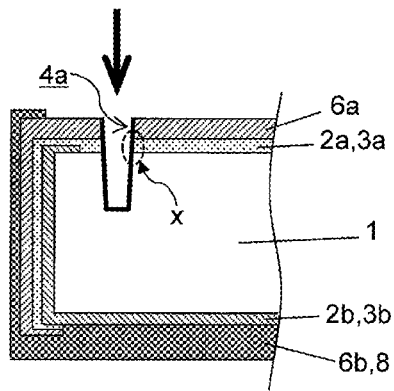
FIGS. 5A to 5C show conceptual views for explaining formation of an insulation-processed region by applying laser light.
Figure 5:
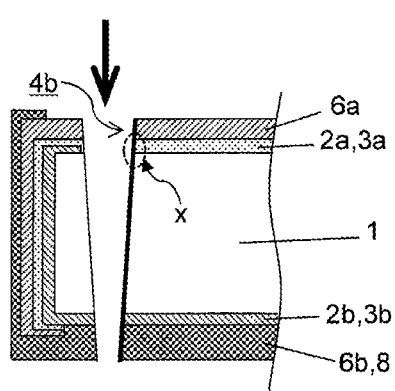
Figure 5:
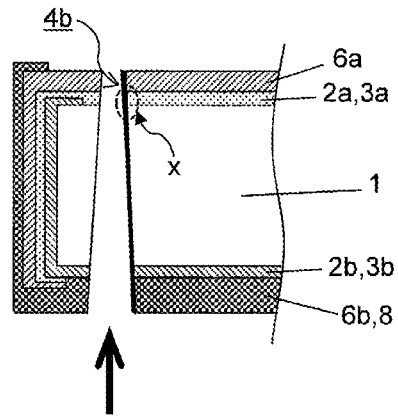
Figure 6:
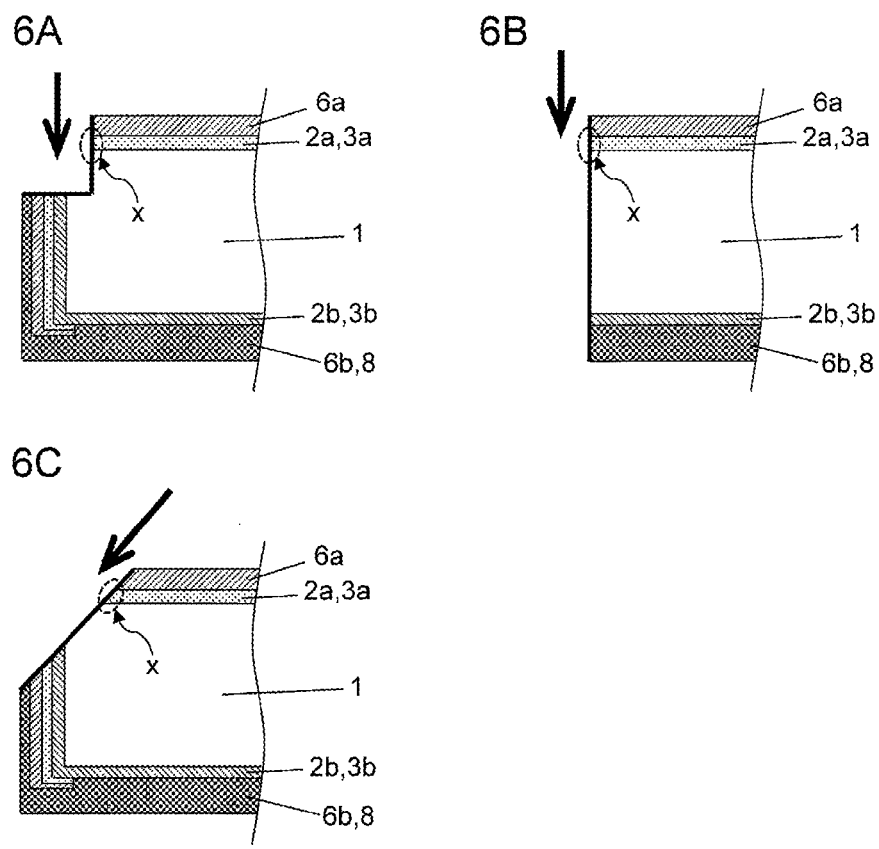
FIGS. 6A to 6C show conceptual views for explaining formation of an insulation-processed region by applying laser light.
Figure 7:
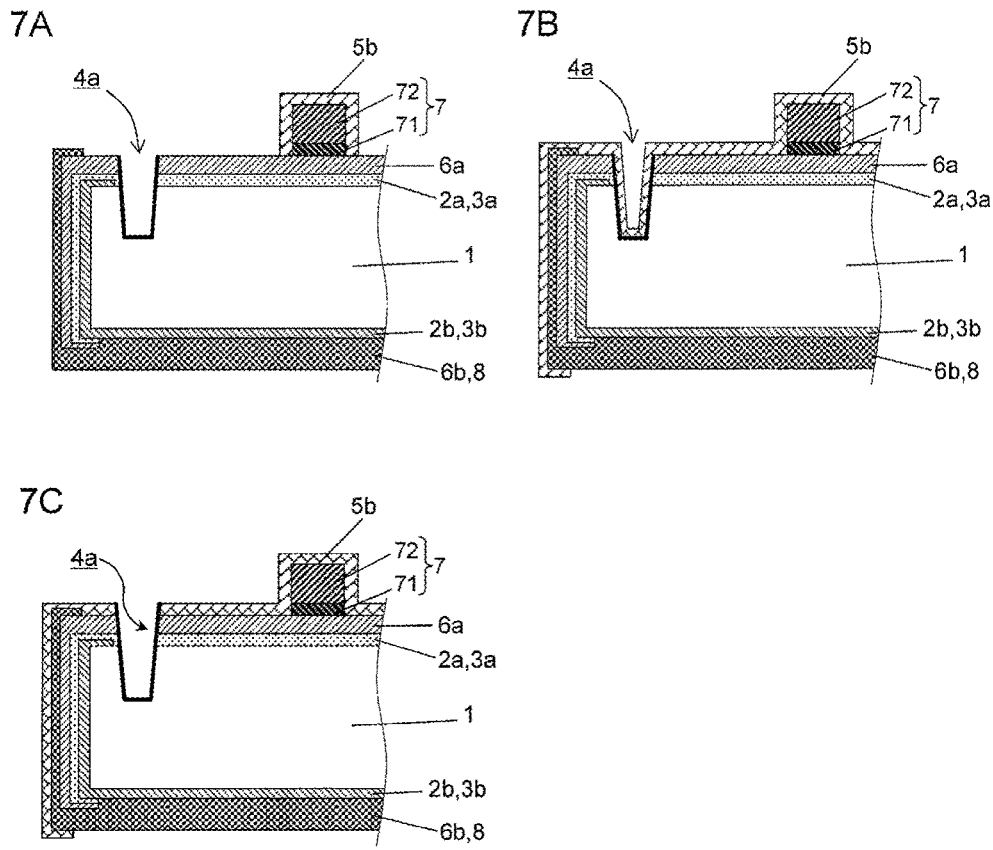
FIGS. 7A to 7C show conceptual views which each show a configuration of a heterojunction solar cell after the formation of the protecting layer.

Herein, a description is provided for a short-circuit between the light-receiving side and the back side of the photoelectric conversion section. FIG. 4 is a sectional view schematically showing a state in a vicinity of an end section of a photoelectric conversion section, in which silicon-based thin-films 2a and 3a and a transparent electrode layer 6a are formed on a first principal surface of a crystalline silicon substrate 1, and silicon-based thin-films 2b and 3b, a back side transparent electrode layer 6b, and a back side metal electrode 8 are formed on a second principal surface of the crystalline silicon substrate 1. FIG. 4 schematically shows a structure wherein an intrinsic silicon-based thin-film 2b and a silicon-based thin-film 3b of the first conductivity-type (n-type) are formed on the second principal surface of the crystalline silicon substrate 1 of the first conductivity-type (n-type), an intrinsic silicon-based thin-film 2a and a silicon-based thin-film 3b of the opposite conductivity-type (p-type) are thereafter formed thereon, and thereafter a light-receiving side transparent electrode layer 6a and a back side transparent electrode layer 6b and a back side metal electrode 8 are formed (the order of formation of the layers of the heterojunction solar cell is not limited to the configuration shown in FIG. 4).

When the layers are formed by a CVD method, a sputtering method, or the like without using a mask, the intrinsic silicon-based thin-film 2b, the silicon-based thin-film 3b of the first conductivity-type, the back side transparent electrode layer 6b, and the back side metal electrode 8 on the back side of the crystalline silicon substrate 1 extend to the side surface and the light-receiving surface of the crystalline silicon substrate 1 due to wraparound during deposition. The intrinsic silicon-based thin-film 2a, the silicon-based thin-film 3a of the opposite conductivity-type, and the light-receiving side transparent electrode layer 6a, which are formed on the light-receiving surface of the crystalline silicon substrate 1, extend to the side surface and the back side of the crystalline silicon substrate 1 due to wraparound during deposition.

When such wraparound occurs, the characteristics of the solar cell may be deteriorated as the semiconductor layer and the electrode layer on the light-receiving side and the semiconductor layer and the electrode layer on the back side are short circuited as is understood from FIG. 4. In the manufacturing method of the present invention, the short circuit between the first principal surface and the second principal surface of the photoelectric conversion section resulting from wraparound is removed by performing an insulation process.

Figure 5A:
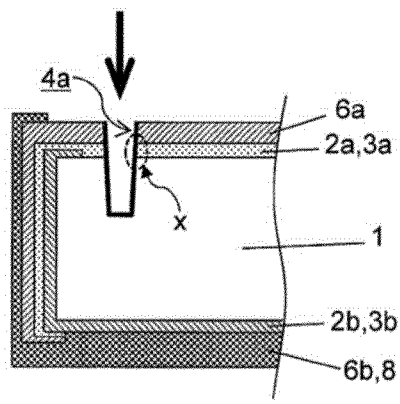

The insulation process is performed by applying laser light from the first principal surface side or the second principal surface side of the photoelectric conversion section to the crystalline silicon substrate 1. For example, as shown in FIG. 5A, a groove-shaped insulation-processed region (region depicted with a bold line) extending through the light-receiving side transparent electrode layer 6a, the silicon-based thin-film of the opposite conductivity-type 3a, and the intrinsic silicon-based thin-film 2a is formed by applying laser light from the first principal surface side. At this time, the groove is formed so as to extend to the silicon substrate 1 in order to reliably eliminate the short-circuit of the silicon-based thin-film.

Here, when the insulation process is not performed, the silicon-based thin-film of the first conductivity-type (n-type) 3b wraps around to the first principal surface to form an opposite junction to the silicon-based thin-film of the opposite conductivity-type (p-type) 3a, in addition to formation of a pn-junction (opposite junction) between the crystalline silicon substrate of the first conductivity-type (n-type) 1 and the silicon-based thin-film of the opposite conductivity-type (p-type) 3a, in the vicinity of the peripheral end of the first principal surface side as shown in a region R surrounded by the ellipse in FIG. 4. The undesired opposite junction part in the first principal surface causes leakage, leading to deterioration of conversion characteristics (mainly open circuit voltage and fill factor) of the solar cell. Thus, in the insulation process step, it is preferred that the insulation-processed region is formed so as to eliminate the undesired opposite junction in the vicinity of the peripheral end of the first principal surface. In the heterojunction solar cell, deterioration of characteristics due to a short-circuit between the light-receiving side transparent electrode layer 6a and the back side transparent electrode layer 6b or the back side metal electrode 8 is significant, and therefore the insulation-processed region is formed so as to eliminate the short-circuit between these transparent electrode layers.

Figure 5B:
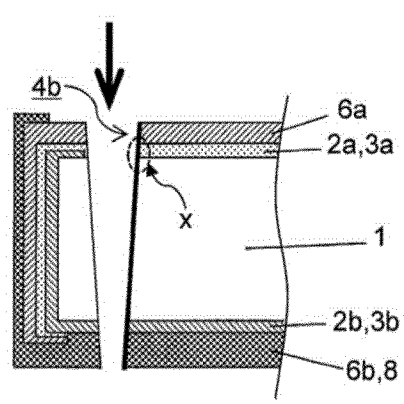
Figure 5C:
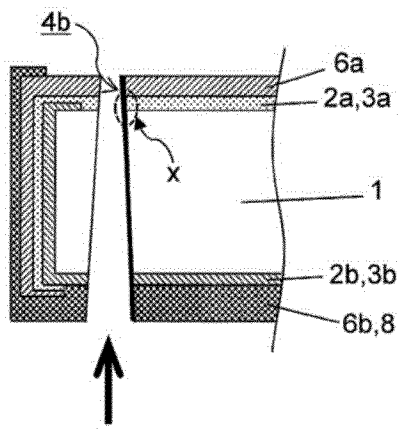

The insulation-processed region is not limited to a groove-shaped region as illustrated in FIG. 1 and FIG. 5A. For example, as shown in FIGS. 5B and 5C, laser light may be applied from the first principal surface side or the second principal surface side to form a cutting line (one formed by linearly coupling holes extending through the photoelectric conversion section from the first principal surface to the second principal surface thereof), thereby removing the peripheral end of the photoelectric conversion section by cleavage. The photoelectric conversion section can also be cleaved by applying laser light from the first principal surface side or the second principal surface side to form a groove, and bending and breaking the silicon substrate with the groove as an origination point.

Preferably, laser light is applied from the first principal surface side for making it easy to register the collecting electrode formation position and the groove. When the back side metal electrode 8 is formed on the whole of the second principal surface as shown in FIG. 1, adhesion (fusion) of a metallic material to the insulation-processed region or diffusion of a metal from the insulation-processed region may occur if laser light is applied from the second principal surface side. Therefore, it is preferred that laser light is applied from the first principal surface side for suppressing diffusion of the metal in the back electrode. Preferably, the insulation-processed region is formed only by laser processing for shortening the production process. Thus, it is preferred that as the insulation-processed region, a groove extending through the transparent electrode layer 6a and the silicon-based thin-films 3a and 2a to reach the crystalline silicon substrate 1 is formed in the vicinity of the peripheral end of the first principal surface as shown in FIG. 5B.

Figure 6A:
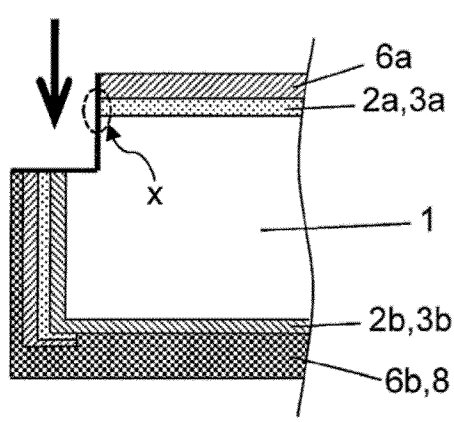
Figure 6B:
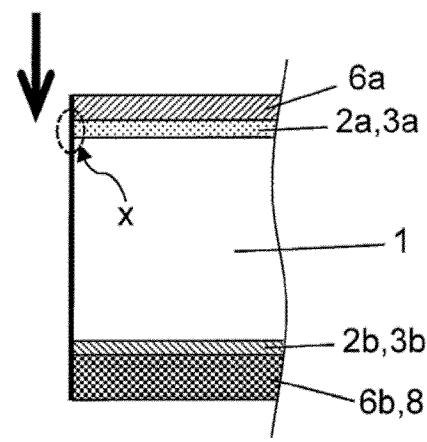
Figure 6C:
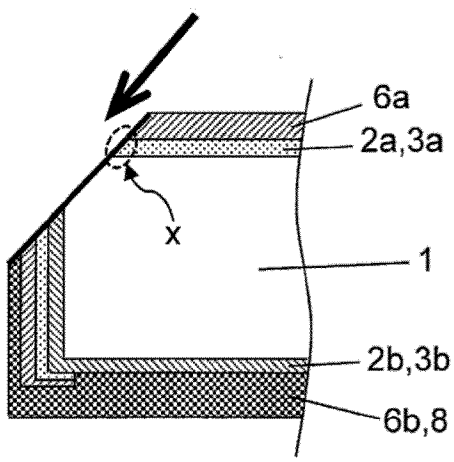

The insulation-processed region may be formed so as to extend over the first principal surface and the side surface of the photoelectric conversion section. For example, as shown in FIG. 6A, the silicon-based thin-films 2a and 3a and the transparent electrode layer 6a in the vicinity of the peripheral end on the first principal surface of the photoelectric conversion section, and silicon-based thin-films 2b and 3b and the electrode layers 6b and 8 formed in the vicinity of the peripheral end of the first principal surface by wrapping around from the back surface are removed by applying laser light from the vicinity of the peripheral end on the first principal surface side of the photoelectric conversion section. The silicon-based thin-film and the electrode layer formed on the side surface of the silicon substrate 1 are also removed by laser processing. At this time, as shown in FIG. 6B, all the front side and the back side silicon-based thin-film and electrode layers formed on the side surface from the first principal surface to the second principal surface may be removed. As shown in FIG. 6C, the insulation-processed region can also be formed by applying laser light in an oblique direction so as to process the corner section between the first principal surface and the side surface of the silicon substrate 1.

A laser used for the insulation process is not limited, as long as it is capable of forming grooves and/or cutting lines to the crystalline silicon substrate. A laser power is preferably about 1 to 40 W, for example. An optical diameter of laser light to be used may be, for example, 20 to 200 µm. By irradiation of laser light in the above-described conditions, the grooves or cutting lines having substantially the same width as the optical diameter of laser light can be formed. The depth of the groove can be appropriately set. When the silicon substrate is bent and broken to perform cleavage after formation of the groove, the depth of the groove can be appropriately set so that the substrate is easily cleaved along the groove.

When the groove is formed by application of laser light, the formed groove corresponds to the insulation-processed region 4a (see FIG. 5A). When the photoelectric conversion section is cleaved by application of laser light (including a case where the substrate is bent and broken after formation of the groove by application of laser light), the cut surface (side surface of the photoelectric conversion section) corresponds to the insulation-processed region 4b (see FIGS. 5B and 5C). In any case, laser processing influences the inside of the silicon substrate 1, and therefore in the insulation-processed region (bold line parts in FIGS. 5A to 5C and FIGS. 6A to 6C), the silicon substrate 1 is exposed.

When an impurity such as a metal diffuses into the silicon substrate from the exposed area of the crystalline silicon substrate in the insulation-processed region, and diffuses, the characteristics of the solar cell tend to be deteriorated. Particularly, when the collecting electrode is formed of a metallic material having high diffusibility, such as copper, it is necessary to suppress diffusion of a metal into the silicon substrate from the insulation-processed region. In the present invention, a protecting layer is provided for suppressing diffusion of a metal from the insulation-processed region.

When the insulation-processed region is formed by application of laser light, a short-circuit between the front and the back surfaces of the photoelectric conversion section is eliminated, but an additional leak pass is generated between the silicon substrate of the first conductivity-type and the silicon-based thin-film of the opposite conductivity-type due to a decrease in resistivity at the laser-processed surface (regions x in FIGS. 5A to 5C and FIGS. 6A to 6C), and adhesion of an electroconductive material. For example, a new surface of a semiconductor is instable, and therefore in the insulation-processed region formed by application of laser light, the resistivity tends to decrease due to adhesion of only a slight amount of an impurity. Amorphous silicon is micro-crystallized by application of laser light, and therefore in the insulation-processed region formed by application of laser light, the silicon-based thin-film of the opposite conductivity-type 3a and the intrinsic silicon-based thin-film 2a are micro-crystallized, so that the resistivity tends to decrease. Further, diffusion of the electroconductive material of the transparent electrode layer 6a and fusion of the electroconductive material to a processed surface (insulation-processed region) during laser processing may occur. In the present invention, a heating treatment is performed for eliminating additional leakage occurring as a result of the insulation process.

<Formation of Protecting Layer and Heating Treatment>

As described above, the insulation-processed region is formed by application of laser light to eliminate a short-circuit between the first principal surface and the second principal surface, so that the conversion efficiency of the solar cell can be improved. However, when the insulation-processed region is formed, a sufficient conversion efficiency improvement effect may not be obtained because a leak pass is generated between the silicon substrate of the first conductivity-type and the silicon-based thin-film of the opposite conductivity-type, and a metal diffuses into the silicon substrate from the insulation-processed region.

On the other hand, in the first embodiment of the manufacturing method of the present invention, the protecting layer 5b for preventing diffusion of a metal contained in the collecting electrode is formed on the collecting electrode 7. Thus, isolation of the metal in the collecting electrode is suppressed, so that diffusion of the metal into the crystalline silicon substrate from the insulation-processed region can be reduced. Further, the insulation-processed region is heated, so that leakage between the crystalline silicon substrate of the first conductivity-type and the silicon-based layer of the opposite conductivity-type, which occurs in the insulation process step, can be eliminated.

In the first embodiment of the manufacturing method of the present invention, a heating treatment for eliminating leakage at the insulation-processed region is performed after the protecting layer is formed on the collecting electrode. As described in detail later, the heating treatment for eliminating leakage at the insulation-processed region is performed at a temperature of about 150° C. or higher, and therefore a plating metal such as copper for forming the collecting electrode may diffuse during the heating treatment step. On the other hand, in the manufacturing method of the present invention, a heating treatment is performed after the protecting layer 5b for suppressing diffusion of a metal is provided on the collecting electrode 7, and therefore isolation of the metal from the collecting electrode is suppressed.

(Formation of Protecting Layer on Collecting Electrode)

The protecting layer 5b on the collecting electrode 7 is provided for the purpose of suppressing isolation of a metal contained in the collecting electrode 7 to prevent diffusion (penetration) of the metal into the silicon substrate 1 from the insulation-processed region 4a. By forming the protecting layer on the collecting electrode, degeneration of the metal seed 71 and the plating metal layer 72 by oxidation, etc., in the heating treatment step described later can be suppressed. Preferably, the protecting layer 5b is formed so as to cover the whole surface of the collecting electrode 7 for suppressing isolation of a metal contained in the collecting electrode 7.

However, when the protecting layer 5b is insulating, the protecting layer 5b may have an opening at a connection spot with an interconnector for making it easy to electrically connect the collecting electrode and the interconnector during modularization. In this case, it is preferred that the heating treatment step is performed after the opening section is closed by connection with the interconnector.

The material of the protecting layer 5b may be an electroconductive material or an insulating material. When an electroconductive material is used, the resistance of the collecting electrode can be decreased, so that a current loss in the collecting electrode can be reduced. When the material of the protecting layer 5b is an electroconductive material, the collecting electrode can be easily electrically connected to the interconnector, such as a tab or a bus bar, during modularization of the solar cell.

As the electroconductive material of the protecting layer 5b, a material that causes less diffusion into the silicon substrate 1 when compared with a metallic material that forms the plating metal layer 72 of the collecting electrode 7, is used. For example, when the metal layer 72 mainly composed of Cu is formed by electroplating, a metal such as Ti, Cr, Ni, Sn, or Ag is preferably used as the electroconductive material of the protecting layer 5b. Further, for improving solder adhesion during modularization, Ag or Sn is especially preferably used as the electroconductive material of the protecting layer 5b. The thickness of the protecting layer 5b is not particularly limited. For suppressing diffusion of a metal in the collecting electrode, the thickness of the protecting layer 5b is preferably 0.5 µm or more, more preferably 1 µm or more. For suppressing a shading loss caused by the protecting layer 5b formed on the side surface of the collecting electrode, the thickness of the protecting layer 5b is preferably 5 µm or less, more preferably 3 µm or less.

The method for forming the protecting layer 5b on the collecting electrode 7 is not particularly limited, and a dry process such as sputtering, vapor deposition, or CVD, or a wet process such as printing, electroplating, electroless plating, or the like may be used. Particularly, a method is preferred which is capable of selectively forming on the collecting electrode 7 the protecting layer 5b composed of an electroconductive material while an electroconductive material is not formed on the transparent electrode layer 6a. For example, when a mask having an opening corresponding to the pattern shape of the collecting electrode is used, the protecting layer 5b composed of an electroconductive material can be selectively formed on the collecting electrode 7 by a dry process. When an insulating layer of a resist or the like is used for formation of a collecting electrode by electroplating, a protecting layer composed of an electroconductive material can also be selectively formed on the plating metal layer 72 by a dry process, a wet process, a plating method, or the like after electroplating and before removal of the insulating layer (FIGS. 2A3 and 2B4; and FIG. 3D3, etc.).

Figure 7A:
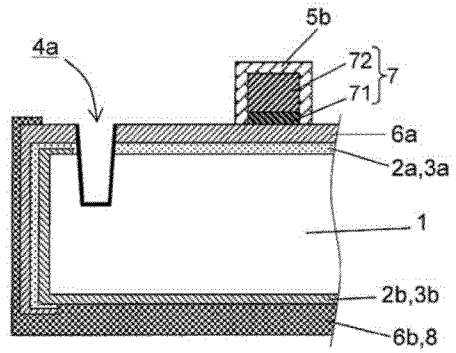
Figure 7B:
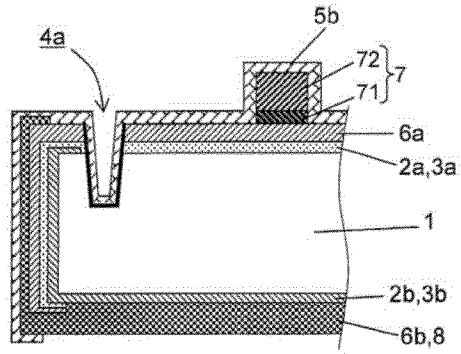
Figure 7C:
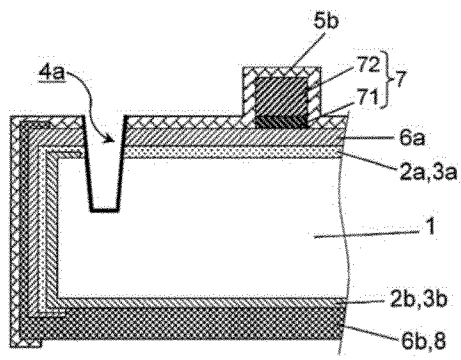
Figure 8:
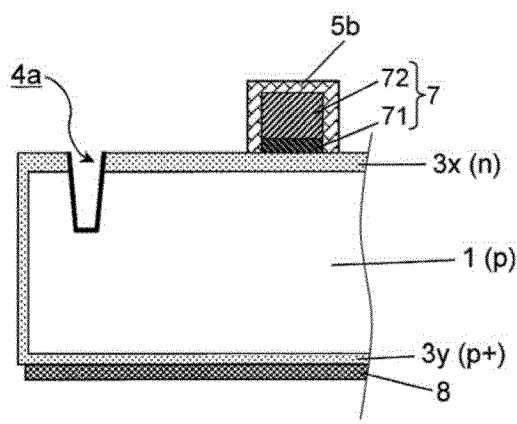

Preferably, the protecting layer 5b is also formed on the side surface of the collecting electrode 7 as shown in FIGS. 7A to 7C for inhibiting diffusion of a metal contained in the collecting electrode. For selectively forming the electroconductive protecting layer 5b on the surface and the side surface of the collecting electrode 7, replacement plating (immersion plating), a type of electroless plating is preferably employed. Replacement plating is electroless plating using a difference in ionization tendency between different kinds of metals, and when an electrochemically basic metal (adherend) is immersed in a replacement plating solution in which ions of a noble metal are dissolved, the basic metal as an adherend is dissolved in the replacement plating solution, and the noble metal is deposited on the surface of the adherend.

In replacement plating, it is also possible to deposit a basic metal on the surface of an adherend as a noble metal by adding in a replacement plating solution a compound capable of forming a complex with a metal. For example, copper is a metal that is noble as compared to tin, but when a replacement plating solution containing a compound capable of forming a complex with copper, such as thiourea, is used, the oxidation-reduction potential of copper decreases, so that tin can be replacement-deposited on the surface of copper.

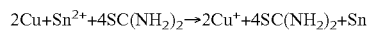

$$2Cu+Sn^{2+}+4SC(NH_2)_2 \rightarrow 2Cu^{+}+4SC(NH_2)_2+Sn$$

The replacement plating solution is preferably an acidic solution for suppressing deposition of tin on the transparent electrode layer 6a. Therefore, the replacement plating solution is preferably a solution containing an acid such as sulfuric acid in addition to tin ions and a copper complexing agent. The replacement plating solution may contain a stabilizer, a surfactant, and so on. A replacement plating solution containing silver ions in addition to tin ions may be used for the purpose of improvement of solder adhesion of the protecting layer 5b, and so on. After a tin layer is formed on a surface of the collecting electrode by replacement plating, a different metal layer such as a silver layer may be formed on the surface by replacement plating.

The protecting layer 5b may be formed on a region other than the collecting electrode (collecting electrode-formed region). The protecting layer 5b may be formed so as to wrap around to the back side of the photoelectric conversion section as long as a short-circuit between the first principal surface and the second principal surface of the photoelectric conversion section can be eliminated. For example, when the protecting layer 5b is made of an insulating material, the protecting layer 5b may also be formed on the insulation-processed region 4a as shown in FIG. 7B. In this case, since the insulation-processed region 4a is also covered with the protecting layer 5b, isolation of a metal from the collecting electrode can be suppressed by the protecting layer 5b on the collecting electrode 7, and diffusion of impurities of an isolated metal, etc., into the silicon substrate 1 and diffusion of moisture, etc., into the silicon substrate 1 through a surface of a sealing material such as EVA in modularization of the solar cell can be suppressed by the protecting layer 5b on the insulation-processed region 4a. Thus, the long-term reliability of the solar cell can be improved. Besides the protecting layer 5b on the collecting electrode 7, an insulating protecting layer may be provided on the insulation-processed region.

When the protecting layer 5b is made of an electroconductive material, the protecting layer 5b may also be formed on a region other than the collecting electrode 7. In this case, it is necessary to prevent formation of the protecting layer on the insulation-processed region. For example, when an insulation process is performed after the electroconductive protecting layer 5b is formed on the whole surface of the collecting electrode 7 and the transparent electrode layer 6a, the protecting layer 5b is removed together with the transparent electrode layer 6a, the silicon-based thin-films 2a and 3a, and the crystalline silicon substrate 1 by application of laser light, so that formation of the protecting layer on the insulation-processed region 4a can be prevented (FIG. 7C).

(Heating Treatment)

In the manufacturing method of the present invention, a heating treatment for eliminating leakage at the insulation-processed region is performed. By the heating treatment, the surface of the insulation-processed region is insulated, so that leakage can be eliminated. For reliably eliminating leakage, the heating treatment temperature is preferably 150° C. or higher, more preferably 170° C. or higher. On the other hand, for suppressing thermal degradation of the transparent electrode layer and the silicon-based thin-film, diffusion of a dope impurity, and so on, the heating treatment temperature is preferably 250° C. or lower, more preferably 230° C. or lower.

As long as the surface of the insulation-processed region can be made non-conductive by performing heating at the above-mentioned temperature, other conditions such as an atmosphere and a pressure are not particularly limited, and the heating treatment can be performed in any of an air pressure atmosphere, a reduced pressure atmosphere, a vacuum, and a pressurized atmosphere. The heating treatment can be performed in the air using, for example, an oven or the like. The heating time can be appropriately set according to a heating temperature as long as leakage can be eliminated by making the insulation-processed region nonconductive. For example, when the heating treatment is performed in the air, the heating time is preferably 20 minutes or more for the heating temperature of 150° C., and 15 minutes or more for the heating temperature of 160° C.

<Order of Steps>

As described above, formation of the photoelectric conversion section (photoelectric conversion section providing step), formation of the collecting electrode by an electroplating method (collecting electrode forming step), formation of the insulation-processed region by application of laser light (insulation process step), formation of the protecting layer on the collecting electrode (protecting layer forming step), and a heating treatment for eliminating leakage at the insulation-processed region (heating treatment step) are performed in the first embodiment of the present invention. In the manufacturing method of the present invention, the heating treatment step is performed after the protecting layer forming step. That is, heating is performed after the protecting layer 5b for suppressing isolation and diffusion of a plating metal is provided on the collecting electrode 7, and therefore in the heating treatment step, diffusion of metal components into the silicon substrate from the insulation-processed region is suppressed.

Since the protecting layer 5b is provided on the collecting electrode 7, degradation of the collecting electrode by oxidation, etc., in the heating treatment step can also be suppressed. Further, since the resistance of an electrode formed by electroplating tends to be reduced by heating, an effect of reducing the resistance of the collecting electrode to further reduce a current loss in the collecting electrode can be obtained owing to the heating treatment step.

As long as the heating treatment is performed after formation of the protecting layer, the order of the above-mentioned steps is not otherwise particularly limited. When the insulation-processed region is exposed to a plating solution, metal ions in the plating solution may diffuse into the silicon substrate from the insulation-processed region. Therefore, it is preferred that the collecting electrode forming step by electroplating is performed before the insulation process step. Considering the above conditions, in the first embodiment of the manufacturing method of the present invention, the respective steps are performed preferably in an order of; photoelectric conversion section providing step, collecting electrode forming step, insulation process step, protecting layer forming step, and heating treatment step; or photoelectric conversion section providing step, collecting electrode forming step, protecting layer forming step, insulation process step, and heating treatment step. When the electroplating collecting electrode (plating metal layer) 72 is formed on the metal seed 71, the metal seed forming step is performed after the photoelectric conversion section providing step and before the collecting electrode forming step.

When the electroconductive protecting layer 5b is formed by electroplating or electroless plating (including replacement plating), it is preferred that metal components in the plating solution for formation of an electroconductive protecting layer are inhibited from diffusing into the silicon substrate. Thus, when the electroconductive protecting layer 5b is formed by a plating method, it is preferred that the insulation process step and the heating treatment step are performed after the protecting layer forming step.

When metal components in the plating solution can be inhibited from diffusing into the silicon substrate from the insulation-processed region, the collecting electrode forming step by electroplating or formation of an electroconductive protecting layer by electroplating or electroless plating may be performed after the insulation process by application of laser light. For example, when the insulating protecting layer is formed on the insulation-processed region 4a, diffusion of a metal from the insulation-processed region can be suppressed even if the collecting electrode forming step by electroplating is performed after the insulation process step.

For suppressing isolation and diffusion of a metal in the collecting electrode, it is preferred to prevent the silicon substrate from being exposed to a high temperature environment over a period of time after the collecting electrode is formed and before the protecting layer is formed on the collecting electrode. Specifically, it is preferred to refrain from heating at 150° C. or higher over a period of time after formation of the collecting electrode and before formation of the protecting layer. If heating is performed at 150° C. or higher, the heating time is preferably 5 minutes or less, more preferably 3 minutes or less.

Thus, when the protecting layer 5b is formed on the collecting electrode 7 by a dry process such as sputtering, vapor deposition, or CVD, the substrate temperature during formation of the protecting layer 5b is preferably lower than 150° C. After the protecting layer is formed with a thickness that makes it possible to suppress diffusion of metal components in the collecting electrode, the protecting layer can be formed at a temperature of 150° C. or higher. The thickness that makes it possible to suppress diffusion of metal components in the collecting electrode varies depending on a type of metal that forms the collecting electrode 7 and a material of the protecting layer 5b, and is, for example, 100 nm or more, preferably 300 nm or more, more preferably 500 nm or more. For example, deposition may be performed at a low temperature in the initial stage of formation of the protecting layer 5b, and performed at a high temperature after the above-mentioned thickness is achieved. The heating treatment of the insulation-processed region can be performed in parallel to formation of the protecting layer 5b at a high temperature. In this case, it can be considered that the protecting layer forming step is completed in the initial stage of formation of the protecting layer 5b at a low temperature, and the subsequent film formation at a high temperature corresponds to the heating treatment step.

The heating treatment step for eliminating leakage at the insulation-processed region may also serve as other processes in manufacturing of the solar cell. Leakage at the insulation-processed region can also be eliminated by, for example, annealing of cells in modularization of the solar cell, and heating for curing a resin material for sealing. The heating treatment step may be performed after the interconnector is connected onto the collecting electrode. For example, when the protecting layer 5b on the collecting electrode is made of an insulating material, isolation and diffusion of metal components in the collecting electrode during the heating treatment can be prevented by forming the protecting layer 5b having an opening at a connection spot with the interconnector, and closing the opening by connecting the interconnector onto the collecting electrode, and then performing the heating treatment.

<Modularization>

The crystalline silicon-based solar cell manufactured by the above is preferably modularized when put into practical use. Modularization of the solar cell is performed by an appropriate method. For example, by connecting a bus bar via an interconnector such as a TAB to a collecting electrode, a plurality of solar cells are connected in series or in parallel to form a solar cell string. This solar cell string is sealed by a sealing material and a glass plate to obtain a solar cell module.

As described above, an interconnector such as a tab may be connected directly onto the protecting layer 5b when the electroconductive protecting layer 5b is formed on the collecting electrode 7. When the protecting layer 5b is insulating, the collecting electrode 7 and the interconnector can be electrically connected to each other by melting the protecting layer 5b by thermocompression bonding, etc. After elimination of leakage at the insulation-processed region 4a by the heating treatment step, the collecting electrode 7 and the interconnector may be electrically connected to each other after an opening is provided in the protecting layer 5b on the collecting electrode 7, or the protecting layer 5b is removed.

<Example of Application for Pn-Junction Crystalline Silicon-Based Solar Cell>

Although explanations of the first embodiment of the manufacturing method of the present invention have been provided principally for the manufacturing process of the heterojunction solar cell, the present invention can be applied to a manufacture of crystalline silicon-based solar cells other than the heterojunction solar cell.

Figure 8:
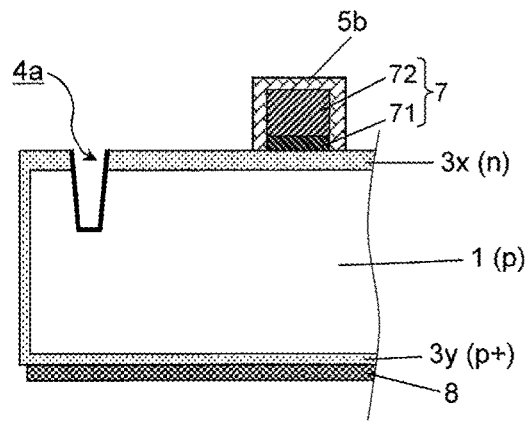
FIG. 8 is a schematic sectional view showing a pn-junction crystalline silicon-based solar cell according to one embodiment.

FIG. 8 is a schematic sectional view showing a configuration in the vicinity of the peripheral end of a pn-junction crystalline silicon-based solar cell manufactured in the first embodiment of the present invention. In the pn-junction crystalline silicon-based solar cell, an opposite conductivity-type (e.g., n-type) silicon-based layer (diffusion layer) 3x is formed on the first principal surface (light-receiving side) of the crystalline silicon substrate 1 of a first conductivity-type (e.g., p-type). A first conductivity-type silicon-based layer 3y (e.g., p$^+$ layer) having a conductivity type identical to that of the crystalline silicon substrate of the first conductivity-type and has a conductive impurity concentration higher than that of the crystalline silicon substrate of the first conductivity-type is formed on the second principal surface of the crystalline silicon substrate 1. The back side metal electrode 8 may be formed on the p$^+$ layer 3y. The collecting electrode 7 is formed on the diffusion layer 3x on the first principal surface of the photoelectric conversion section.

In this configuration, a short-circuit occurs between the silicon-based layer of the opposite conductivity-type (n-type diffusion layer) 3x on the first principal surface side and the silicon-based layer of the first conductivity-type (p$^+$ layer) 3y on the second principal surface side in the photoelectric conversion section, and therefore the insulation-processed region 4a is formed by application of laser light, so that the short-circuit between the front and the back surfaces is eliminated. At this time, an additional leak pass may be generated in the insulation-processed region 4a, but leakage at the insulation-processed region 4a can be eliminated by performing a heating treatment. When the protecting layer 5b is formed on the collecting electrode 7 by electroplating before the heating treatment for elimination of leakage at the insulation-processed region 4a is performed, isolation of metal components in the collecting electrode is suppressed, so that diffusion of a metal into the silicon substrate 1 from the insulation-processed region 4a can be prevented as in the case of the heterojunction solar cell described above.

Thus, even when the present invention is applied for manufacturing of a pn-junction crystalline silicon-based solar cell, leakage is suppressed and diffusion of metal components in the collecting electrode into the silicon substrate is suppressed, so that a solar cell having high conversion efficiency is obtained. FIG. 8 illustrates an example in which the groove 4a is formed so as to extend from the first principal surface side to the crystalline silicon substrate, but a short-circuit between the front and the back surfaces can also be eliminated by forming a grove on the second principal surface side by applying laser light so that the groove extends from the second principal surface side to the crystalline silicon substrate.

Second Embodiment

Figure 9:
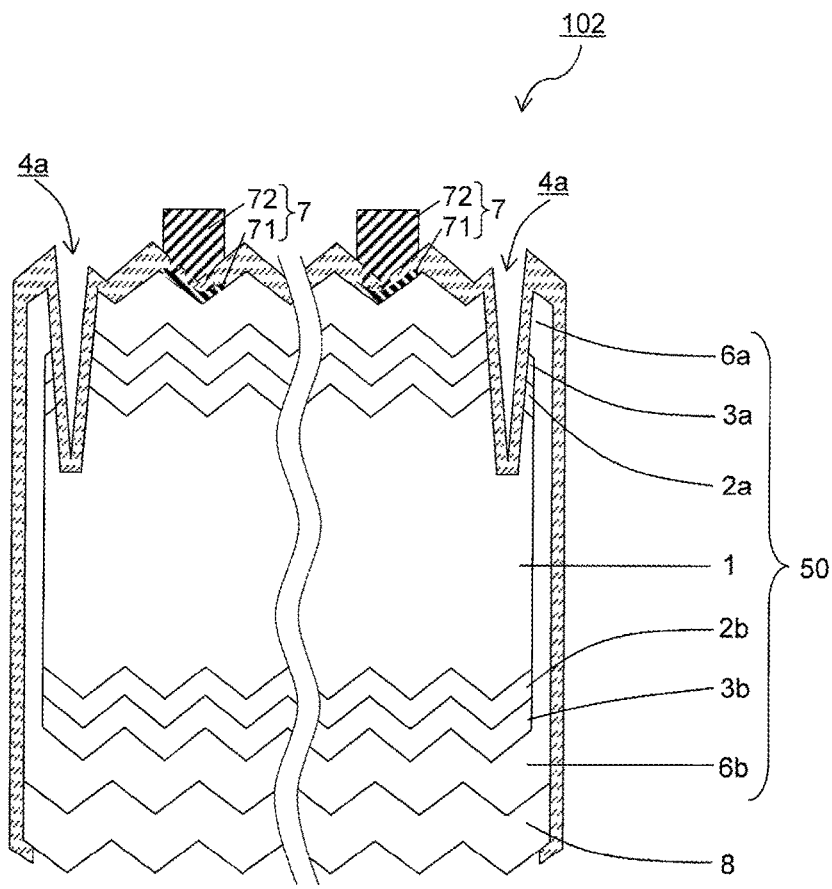
FIG. 9 is a schematic sectional view showing a heterojunction solar cell according to one embodiment.

In the second embodiment of the manufacturing method of the present invention, an insulating material layer is formed on an insulation-processed region as a protecting layer for preventing diffusion of a metal in a collecting electrode. FIG. 9 is a schematic sectional view showing one example of a heterojunction solar cell of the second embodiment, which includes an insulating protecting layer 5a on an insulation-processed region 4a. A heterojunction solar cell 102 shown in FIG. 9 includes a collecting electrode 7 on a light-receiving side transparent electrode layer 6a of a photoelectric conversion section 50. The groove-shaped insulation-processed region 4a is formed on the photoelectric conversion section 50, and the insulating protecting layer 5a is formed on a surface of the insulation-processed region 4a.

In the second embodiment, the photoelectric conversion section 50, the collecting electrode 7 and the insulation-processed region 4a can be formed in the same manner as in the first embodiment. In the second embodiment, a heating treatment for eliminating leakage at the insulation-processed region is also performed after formation of the protecting layer 5a. The heating treatment is performed after the insulating protecting layer 5a is provided on the insulation-processed region 4a, and therefore even if metal components are isolated from the collecting electrode 7, the protecting layer 5a acts as a diffusion barrier layer, so that diffusion (penetration) of metal components into a silicon substrate 1 from the insulation-processed region 4a can be suppressed.

Preferably, a photoelectric conversion section providing step, an insulation process step, a protecting layer forming step, and a heating treatment step are performed in this order in the second embodiment. A collecting electrode forming step by electroplating is performed between the photoelectric conversion section providing step and the insulation process step, between the insulation process step and the protecting layer forming step, between the protecting layer forming step and the heating treatment step, or after the heating treatment step. Particularly, it is preferred that the collecting electrode is formed after the protecting layer is formed on the insulation-processed region. When the collecting electrode is formed by electroplating after a short-circuit between the first principal surface and the second principal surface of the photoelectric conversion section is eliminated by the insulation process, deposition of a plating metal on the second principal surface side is suppressed. When the collecting electrode is formed by electroplating after the protecting layer 5a is formed on the insulation-processed region 4a, metal ions in a plating solution can be inhibited from diffusing into the silicon substrate 1 from the insulation-processed region 4a.

Therefore, in the second embodiment of the manufacturing method of the present invention, it is preferred that the steps are performed in the order of the photoelectric conversion section providing step, the insulation process step, the protecting layer forming step, the collecting electrode forming step, and the heating treatment step; or in the order of the photoelectric conversion section providing step, the insulation process step, the protecting layer forming step, the heating treatment step, and the collecting electrode forming step. When a collecting electrode (plating metal layer) 72 is formed on a metal seed 71 by electroplating, a metal seed forming step is performed after the photoelectric conversion section providing step and before the collecting electrode forming step.

In the second embodiment, as in the first embodiment, the photoelectric conversion section is formed (provided) and the insulation-processed region is formed, followed by forming an insulating material layer as a protecting layer on the insulation-processed region.

<Protecting Layer on Insulation-Processed Region>

By forming the insulating protecting layer 5a on the insulation-processed region 4a, impurities such as an isolated metal from the collecting electrode are inhibited from diffusing into the silicon substrate 1 from the insulation-processed region 4a in the subsequent heating treatment step and during long-term operation of the solar cell, so that deterioration of solar cell performance can be prevented. Since diffusion of impurities into the silicon substrate easily occurs at a region where the silicon substrate is exposed, it is preferred that the protecting layer 5a is formed so as to cover the whole surface of the insulation-processed region 4a.

For preventing leakage through the protecting layer, the material of the protecting layer 5a to be formed on the insulation-processed region is required to be insulating. For suppressing diffusion of impurities in the heating treatment step, the protecting layer 5a is desired to be formed of a material that does not easily degenerate by heating. When the collecting electrode is formed by electroplating method after the protecting layer 5a is formed on the insulation-processed region 4a, the protecting layer 5a is desired to be a material having chemical stability to a plating solution. When an insulating material having high chemical stability to a plating solution is used, the protecting layer 5a hardly degenerates during the collecting electrode forming step by electroplating, and therefore damage to the crystalline silicon substrate 1 is suppressed. When the transparent electrode layer 6a is formed on a surface of the photoelectric conversion section 50 as in the heterojunction solar cell, the protecting layer 5b having high chemical stability to a plating solution is formed on a surface of the transparent electrode layer 6a in addition to the insulation-processed region 4a, and therefore contact between the transparent electrode layer 6a and the plating solution is inhibited, so that deposition of a plating metal layer on the transparent electrode layer 6a can be prevented.

The material of the protecting layer 5a may be an inorganic insulating material or an organic insulating material, as long as the material satisfies the aforementioned characteristics. As the inorganic insulating material, a material such as silicon oxide, silicon nitride, titanium oxide, aluminum oxide, magnesium oxide, or zinc oxide can be used. As the organic insulating material, a material such as polyester, an ethylene-vinyl acetate copolymer, acrylic, epoxy, or polyurethane can be used. From the viewpoints of resistance to a plating solution and transparency of the material, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate, or the like is suitably used.

The protecting layer 5a can be formed using a known method. For example, in the case of an inorganic insulating material such as silicon oxide or silicon nitride, a dry process such as a plasma-enhanced CVD method or a sputtering method is suitably used. In the case of an organic insulating material, a wet process such as a spin coating method or a screen printing method is suitably used. By these methods, a film of a densified structure having reduced defects such as pinholes can be formed. Above all, the protecting layer 5a is preferably formed by the plasma-enhanced CVD method so as to form a film having a more densified structure.

The protecting layer 5a may be also formed on a region other than the insulation-processed region 4a. For example, when the protecting layer 5a is formed on the transparent electrode layer 6a, the transparent electrode 6a can be protected against a plating solution. When the protecting layer 5a is also formed on the collecting electrode 7, isolation and diffusion of a metal in the collecting electrode can be suppressed. When the metal seed 71 is provided in formation of the collecting electrode, the protecting layer 5a can also be provided on the metal seed 71, followed by forming a plating metal layer 72 thereon by electroplating.

When the insulating protecting layer 5b is formed on the transparent electrode layer 6a before formation of the metal seed 71, it is preferred that the protecting layer 5b has an opening corresponding to a collecting electrode-formed region. For example, when the protecting layer 5b is formed by a dry process, a mask having a shape corresponding to the shape of the collecting electrode-formed region may be used during formation of the protecting layer 5b. When a metal layer is formed on the transparent electrode layer 6a by electroplating while a metal seed is not interposed therebetween, it is preferred that the protecting layer 5b has an opening corresponding to the collecting electrode-formed region.

The protecting layer 5b may be formed after formation of the metal seed 71 and before formation of the metal layer 72 by electroplating. In this case, it is preferred to form the protecting layer 5b having an opening corresponding to the shape of the collecting electrode-formed region (i.e. the shape of metal seed). As described in detail later, the protecting layer 5b can be formed on the whole surface of the metal seed 71, followed by forming an opening in the protecting layer on the metal seed, and forming the metal layer 72 by electroplating with the opening as an origination point.

<Collecting Electrode>

In the second embodiment, as in the first embodiment, the collecting electrode 7 (plating metal layer 72) is formed on the first principal surface of the photoelectric conversion section by an electroplating method. As described above, the collecting electrode is formed by electroplating after the insulating protecting layer 5a is formed on the insulation-processed region 4a, so that metal components in a plating solution can be inhibited from diffusing into the silicon substrate 1 from the insulation-processed region 4a. When the protecting layer 5a is also formed on the transparent electrode layer 6a, the transparent electrode layer 6a can be protected against a plating solution. The metal seed 71 may be formed on the first principal surface of the photoelectric conversion section before formation of the collecting electrode by electroplating. In this case, the metal layer 72 is formed on the metal seed 71 by the electroplating method.

<Heating Treatment>

In the second embodiment, as in the first embodiment, a heating treatment is performed for eliminating leakage at the insulation-processed region 4a. By performing the heating treatment after formation of the protecting layer 5a on the insulation-processed region 4a, diffusion of impurities such as a metal into the silicon substrate 1 from the insulation-processed region 4a can be suppressed. The heating treatment can also be performed before formation of the collecting electrode. The heating treatment may be performed between formation of the metal seed 71 and formation of the metal layer 72 by electroplating, or in parallel to these steps. As described in detail later, curing of the metal seed, formation of an opening section in the protecting layer 5a on the metal seed (annealing), and so on can also be performed in parallel to elimination of leakage at the insulation-processed region 4a by the heating treatment.

<Order of Steps>

As described above, formation of the photoelectric conversion section (photoelectric conversion section providing step), formation of the collecting electrode by an electroplating method (collecting electrode forming step), formation of the insulation-processed region by application of laser light (insulation process step), formation of the protecting layer on the insulation-processed region (protecting layer forming step), and a heating treatment for eliminating leakage at the insulation-processed region (heating treatment step) are performed in the second embodiment of the present invention. Also in the second embodiment of the present invention, the heating treatment step is performed after the protecting layer forming step. That is, heating is performed after the protecting layer 5a for preventing diffusion of impurities such as a metal into the silicon substrate 1 is provided on the insulation-processed region 4a, and therefore in the heating treatment step, diffusion of impurities such as a metal into the silicon substrate from the insulation-processed region is suppressed.

Figure 10:
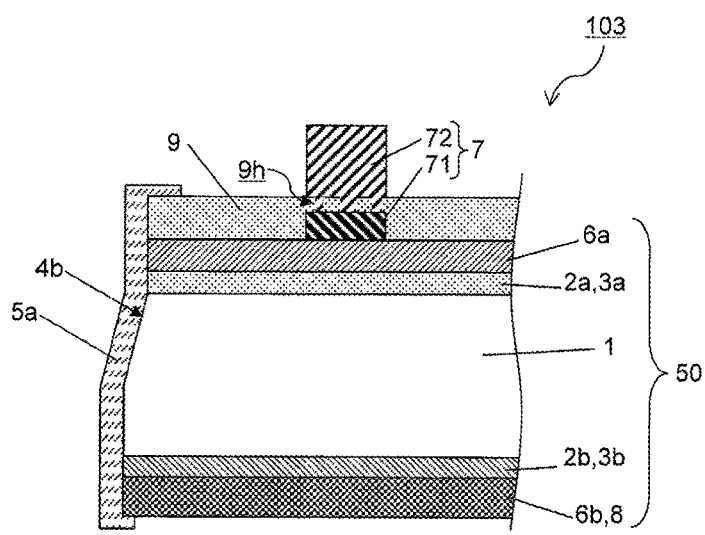
FIG. 10 is a schematic sectional view showing a configuration in the vicinity of the peripheral end of a heterojunction solar cell according to one embodiment.
Figure 11:
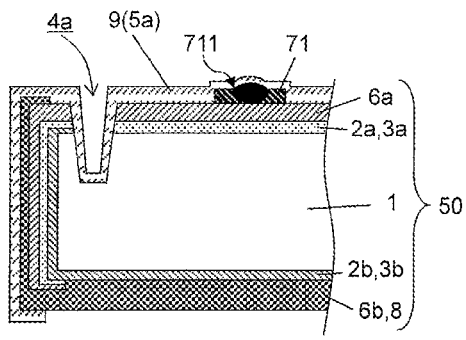
FIGS. 11A and 11B show conceptual views for explaining steps of forming a collecting electrode on an opening section of an insulating layer by electroplating.
Figure 11:
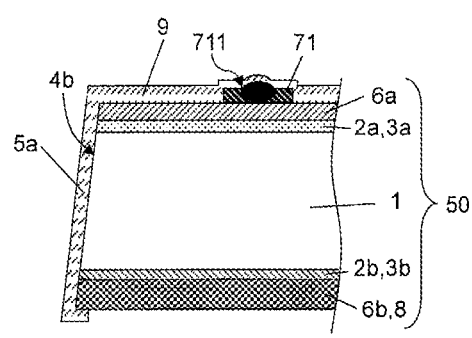
Figure 11:
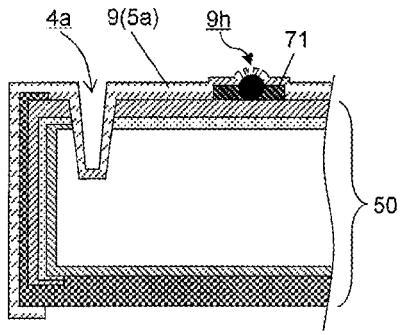
Figure 11:
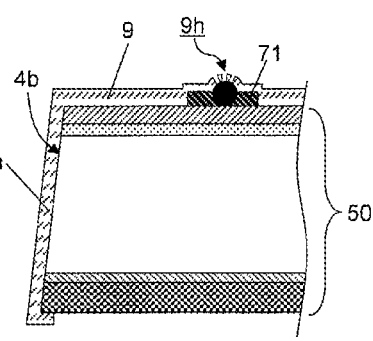
Figure 11:
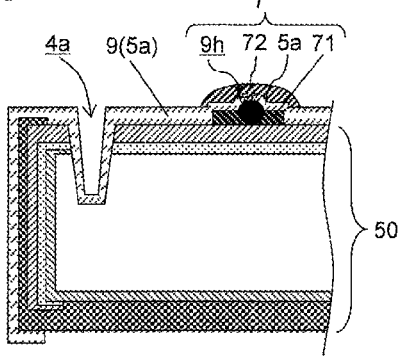
Figure 11:
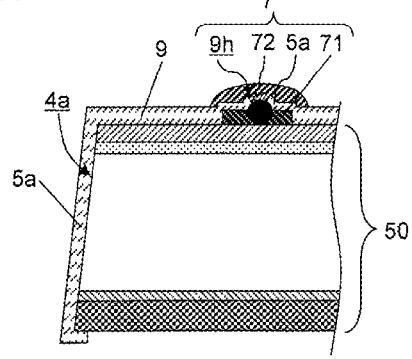

Particularly, in the second embodiment, when the insulation-processed region 4a is formed before formation of the collecting electrode by electroplating, electroplating is performed after a short-circuit between the front and the back surfaces of the photoelectric conversion section is eliminated, and therefore deposition of undesired metal components on the second principal surface side can be suppressed. When the collecting electrode is formed by electroplating after the protecting layer 5a is formed on the first principal surface of the photoelectric conversion section (on the silicon substrate and the transparent electrode layer) in addition to the insulation-processed region 4a, the transparent electrode layer 6a and the silicon substrate 1 can be protected against a plating solution. When an insulating layer 9 different from the protecting layer 5a on the insulation-processed region 4a is formed on the first principal surface of the photoelectric conversion section 50 as shown in FIG. 10, the transparent electrode layer 6a and the silicon substrate 1 can be protected against a plating solution.

<Formation of Collecting Electrode with Opening Section of Insulating Layer as Origination Point>

As described above, in the manufacturing method of the present invention, a first electroconductive layer can be formed on the first principal surface of the photoelectric conversion section as the metal seed 71, followed by providing the insulating protecting layer 5a or the insulating layer 9 on the first electroconductive layer. In this case, for forming a second electroconductive layer 72 (plating metal layer) on the first electroconductive layer 71 by electroplating, it is preferred that an opening section 9h is provided in the protecting layer 5a and the insulating layer 9 on the first electroconductive layer 71, and the second electroconductive layer 72 is deposited with the opening section 9h as an origination point. According to this method, an opening section can be provided in the protecting layer 5a and the insulating layer 9 without using a mask or a resist, and therefore the second electroconductive layer corresponding to the shape of the collecting electrode can be easily formed, so that the process for manufacturing the solar cell can be simplified. A method will be described below in which the opening section 9h is formed in the protecting layer (insulating layer) on the first electroconductive layer (metal seed) 71, and the second electroconductive layer (plating metal layer) 72 is then formed by electroplating.

Figure 11A:
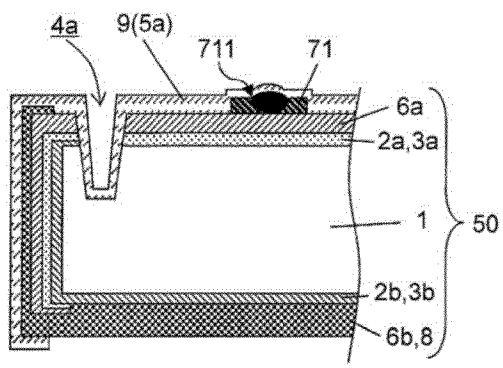
Figure 11A:
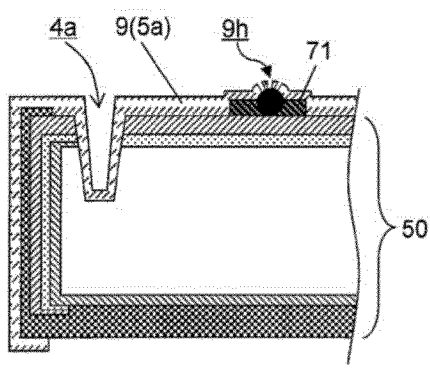
Figure 11A:
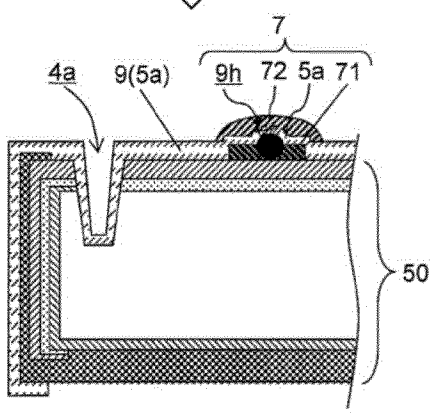
Figure 11B:
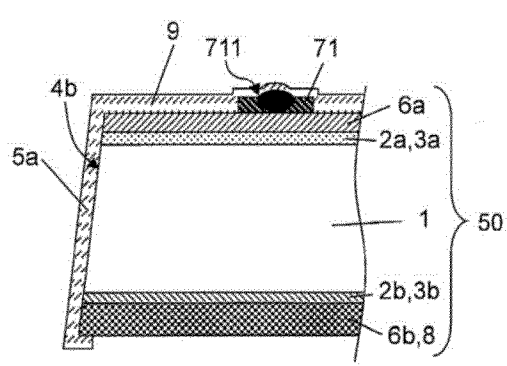
Figure 11B:
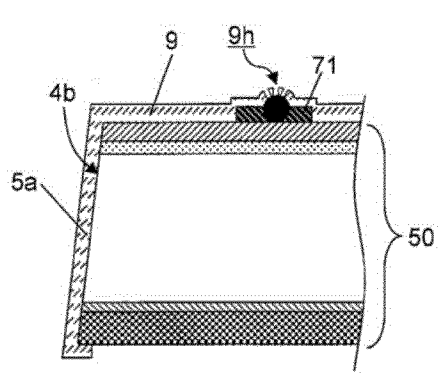
Figure 11B:
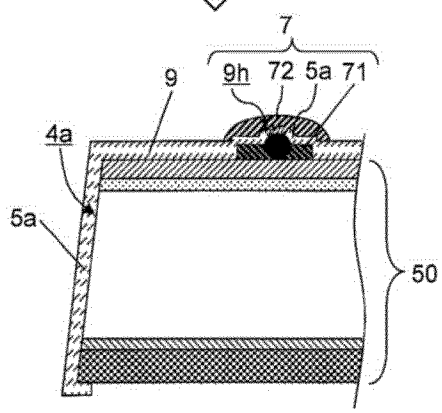

FIG. 11A is a conceptual flow chart, at E1 to E3, for explaining the method in which the opening section 9h is formed in the insulating layer 9 (which may be identical to the protecting layer 5a on the insulation-processed region 4a) on the first electroconductive layer 71, and the second electroconductive layer 72 is formed by an electroplating method with the opening section 9h as an origination point. FIG. 11B shows a conceptual flow chart, at F1 to F3, of a configuration in which an insulation-processed region 4b including a cut surface is provided in place of the groove-shaped insulation-processed region 4a.

In the configuration shown in FIG. 11A at E1 to E3, formation of the insulation-processed region 4a on the photoelectric conversion section 50 by application of laser light and formation of the first electroconductive layer 71 on the photoelectric conversion section 50 are first performed. The order of the insulation process and formation of the first electroconductive layer is not particularly limited.

The insulating protecting layer 5a is formed on the insulation-processed region 4a, and the insulating layer 9 is formed on the first electroconductive layer 71 (FIG. 11A at E1). When the protecting layer 5a is formed on the first principal surface of the photoelectric conversion section without using a mask or a resist, the protecting layer 5a is formed on the first electroconductive layer 71 as well. Therefore, it is unnecessary to form the insulating layer 9 separately, so that the process can be simplified. Hereinafter, an insulating layer formed on the first principal surface (except for the insulation-processed region) of the photoelectric conversion section and the first electroconductive layer is described as the insulating layer 9, and an insulating layer formed on the insulation-processed region is described as the protecting layer 5a, but it is preferred that the insulating layer 9 and the protecting layer 5a are the same layer formed in the same step using the same material. When the insulating layer 9 is identical to the protecting layer 5a, the term "insulating layer 9" below can be replaced with the term "protecting layer 5a".

(First Electroconductive Layer (Metal Seed))

The first electroconductive layer 71 is a layer that functions as an electroconductive underlying layer when the second electroconductive layer 72 is formed by a plating method. Therefore, it suffices that the first electroconductive layer has such a level of electroconductivity that it can function as an underlying layer for electroplating. As previously mentioned, a volume resistivity of $10^{-2}$ Ω·cm or less is defined as being electroconductive. A volume resistivity of $10^{2}$ Ω·cm or more is defined as insulating.

The thickness of the first electroconductive layer 71 is preferably 20 µm or less, more preferably 10 µm or less, in terms of costs. On the other hand, the thickness is preferably 0.5 µm or more, more preferably 1 µm or more, so that the line resistance of the first electroconductive layer 71 falls within a desired range.

The first electroconductive layer 71 contains an electroconductive material. The electroconductive material is not particularly limited, and silver, copper, nickel, tin, aluminum, chromium, silver, gold, zinc, lead, palladium, tungsten, and the like may be used as the electroconductive material. The electroconductive material preferably includes a lowmelting-point material having a thermal-fluidization onset temperature $T_1$. The thermal-fluidization onset temperature is a temperature at which a material is fluidized by heating to change the surface shape of a layer containing a low-melting-point material, and is typically a melting point. As for polymer materials and glass, a material may be softened to be thermally-fluidized at a temperature lower than the melting point. In these materials, the thermal-fluidization onset temperature can be defined as being equal to a softening point. The softening point is a temperature at which the viscosity is $4.5 \times 10^6$ Pa·s (same as the definition for the softening point of glass).

The low-melting-point material is preferably thermally-fluidized in the annealing treatment, thus causing a change in surface shape of the first electroconductive layer 71. Therefore, the thermal-fluidization onset temperature $T_1$ of the low-melting-point material is preferably lower than an annealing temperature Ta described later. In the present invention, the annealing treatment is preferably preformed at the annealing temperature Ta that is lower than the heat-resistant temperature of the photoelectric conversion section 50. Therefore, the thermal-fluidization onset temperature $T_1$ of the low-melting-point material is preferably lower than the heat-resistant temperature of the photoelectric conversion section.

The heat-resistant temperature of the photoelectric conversion section is a temperature at which characteristics of a solar cell module prepared using a solar cell (also referred to as a "solar cell" or a "cell") or a solar cell including the photoelectric conversion section are irreversibly reduced. For example, in the heterojunction solar cell, the crystalline silicon substrate that forms the photoelectric conversion section 50 hardly undergoes a change in characteristics even when heated to a high temperature of 500° C. or higher, but the transparent electrode layers and the amorphous silicon-based thin-films may undergo thermal degradation or diffusion of dope impurities when heated to about 250° C., thus causing an irreversible reduction in the solar cell characteristics. Therefore, in the heterojunction solar cell, the first electroconductive layer 71 preferably contains a low-melting-point material having a thermal-fluidization onset temperature $T_1$ of 250° C. or lower.

The lower limit of the thermal-fluidization onset temperature $T_1$ of the low-melting-point material is not particularly limited. The low-melting-point material is preferably not thermally-fluidized in the formation of the first electroconductive layer (metal seed forming step), so that an amount of surface shape change of the first electroconductive layer in the annealing treatment is increased to form the opening section 9h in the insulating layer 9 easily. For example, when the first electroconductive layer is formed by coating or printing, heating may be performed for drying. In this case, the thermal-fluidization onset temperature $T_1$ of the low-melting-point material is preferably higher than the temperature of heating for drying the first electroconductive layer. Accordingly, the thermal-fluidization onset temperature $T_1$ of the low-melting-point material is preferably 80° C. or higher, more preferably 100° C. or higher.

The low-melting-point material may be an organic substance or an inorganic substance as long as the thermal-fluidization onset temperature $T_1$ falls within the aforementioned range. The low-melting-point material may be electroconductive or insulating, but is desired to be a metallic material that has electroconductivity. If the low-melting-point material is a metallic material, the resistance value of the first electroconductive layer can be decreased, so that uniformity of the thickness of the second electroconductive layer can be improved when the second electroconductive layer is formed by electroplating. If the low-melting-point material is a metallic material, the contact resistance between the photoelectric conversion section 50 and the collecting electrode 7 can also be reduced. As the low-melting-point material, a low-melting-point metallic material alone or an alloy thereof, or a mixture of a plurality of low-melting metallic materials can be suitably used. Examples of the low-melting-point metallic material include indium, bismuth, and gallium.

The first electroconductive layer 71 preferably contains, in addition to the aforementioned low-melting-point material, high-melting-point material as the electroconductive material having thermal-fluidization onset temperature $T_2$ that is relatively higher than the thermal-fluidization onset temperature of the low-melting-point material. When the first electroconductive layer 71 includes a high-melting-point material, a conductive connection can be efficiently established between the first electroconductive layer and the second electroconductive layer, so that conversion efficiency of the solar cell can be improved.

The thermal-fluidization onset temperature $T_2$ of the high-melting-point material is preferably higher than the annealing temperature Ta. That is, when the first electroconductive layer 71 contains the low-melting-point material and the high-melting-point material, the thermal-fluidization onset temperature $T_1$ of the low-melting-point material, the thermal-fluidization onset temperature $T_2$ of the high-melting-point material, and the annealing temperature Ta in the annealing treatment preferably satisfy $T_1 < Ta < T_2$. The high-melting-point material may be an insulating material or an electroconductive material, but is preferably an electroconductive material in order to reduce the resistance of the first electroconductive layer. When the electroconductivity of the low-melting-point material is low, the overall resistance of the first electroconductive layer can be reduced by using a material having high electroconductivity as the high-melting-point material. As the electroconductive high-melting-point material, for example, a metallic material alone such as silver, aluminum, or copper, or a plurality of metallic materials can be suitably used.

When the first electroconductive layer 71 contains the low-melting-point material and the high-melting-point material, the content ratio thereof is appropriately adjusted from the viewpoints of suppression of disconnecting by coarsening of the low-melting-point material as described above, the electroconductivity of the first electroconductive layer, ease of forming an opening section in the insulating layer (increase of the number of origination points for metal deposition on the second electroconductive layer), and so on. The optimum value of the content ratio varies depending on combinations of materials and particle sizes used, but for example, the weight ratio between the low-melting-point material and the high-melting-point material (low-melting-point material high-melting-point material) is set in a range of 5:95 to 67:33. The weight ratio between the low-melting-point material the high-melting-point material is more preferably set from 10:90 to 50:50, further preferably set from 15:85 to 35:65.

When a particulate low-melting-point material such as metal particles is used as a material of the first electroconductive layer 71, the particle size $D_L$ of the low-melting-point material is preferably no less than 1/20, more preferably no less than 1/10, of the thickness d of the first electroconductive layer, so that a formation of an opening section in the insulating layer in the annealing treatment is facilitated. The particle size $D_L$ of the low-melting-point material is preferably 0.25 µm or more, more preferably 0.5 µm or more. When particles are non-spherical, the particle size is defined by the diameter of a circle having an area equal to the projected area of particles (projected area-circle equivalent diameter, Heywood diameter).

The shape of particles of the low-melting-point material is not particularly limited, but is preferably a non-spherical shape such as a flat shape. Non-spherical particles formed by binding spherical particles together by a method such as sintering are also suitably used. In general, when metal particles are brought into a liquid phase state, the surface shape tends to be spherical for reducing surface energy. If the low-melting-point material of the first electroconductive layer before carrying out the annealing treatment is non-spherical, the amount of change in surface shape of the first electroconductive layer is larger because particles become more spherical when heated to the thermal-fluidization onset temperature $T_1$ or higher in the annealing treatment. Therefore, it becomes easy to form an opening section in the insulating layer 9 on the first electroconductive layer 71.

Besides using the combination of the low-melting-point material and the high-melting-point material described above as the material of the first electrically conductive layer 71, conversion efficiency may also be improved by adjusting the size of materials (e.g., particle size) and the like to suppress the disconnecting of the first electroconductive layer due to heating during the annealing treatment. For example, even a material having a high melting point, e.g., silver, copper or gold, in the form of fine particles having a particle size of 1 µm or less, undergoes sintering-necking (fusion of fine particles) at a temperature lower than the melting point, i.e., about 200° C., or a lower temperature $T_1'$, and therefore can be used as the "low-melting-point material" of the present invention. When heated to the sintering-necking onset temperature $T_1'$ or higher, the material that undergoes sintering-necking is deformed at and near the outer periphery of fine particles, so that the surface shape of the first electroconductive layer can be changed to form an opening section in the insulating layer 9. Even when fine particles are heated to the sintering-necking onset temperature or higher, the fine particles retains a solid phase state at any temperature that is lower than a melting point $T_2'$, and therefore disconnecting by coarsening of the material hardly occurs. In this respect, it can be said that the material that undergoes sintering-necking, such as metal fine particles, has an aspect of the "high-melting-point material" as well while being the "low-melting-point material" in the present invention.

In the material forming the first electroconductive layer, an insulating material is preferably included besides the aforementioned electroconductive material (e.g., low-melting-point material and/or the high-melting-point material). As the insulating material such as a paste including binder resin or the like is preferably used. For sufficiently improving the electroconductivity of the first electroconductive layer formed by a screen printing method, it is desirable to cure the first electroconductive layer by a heating treatment. Therefore, for the binder resin contained in the paste, a material that can be cured at the aforementioned drying temperature is preferably used, and an epoxy-based resin, a phenol-based resin, an acryl-based resin, and the like are applicable. Conditions for curing the paste material of the first electroconductive layer are set according to a type of binder, and so on. Curing of the electroconductive paste material may also serve as a heating treatment for eliminating leakage between the crystalline silicon substrate of the first conductivity-type and the silicon-based layer of the opposite conductivity-type in the insulation-processed region 4a.

When the electroconductive material includes low-melting-point material, the shape of the low-melting-point material is changed as the binder resin is cured, and an opening section (cracks) is easily generated in the insulating layer near the low-melting-point material during the annealing treatment. It suffices that the ratio between the binder resin and the electroconductive material is set so as to be equal to or more than the so-called percolation threshold (a critical value of a ratio corresponding to the low-melting-point material content at which electroconductivity is exhibited).

Explanations have been provided above principally for the case of forming the first electroconductive layer by a printing method, but the method for forming the first electroconductive layer is not limited to the printing method. For example, the first electroconductive layer may be formed by a vapor deposition method or a sputtering method using a mask matching the pattern shape. The first electroconductive layer may be composed of multilayers. The first electroconductive layer may have, for example, a layered structure composed of a lower layer having a low contact resistance with a transparent electrode layer on the surface of a photoelectric conversion section and an upper layer containing an electroconductive material. According to this structure, it can be expected that the fill factor of the solar cell is improved as contact resistance with the transparent electrode layer decreases. It can be expected that the first electroconductive layer is made still less resistive by forming a layered structure of a layer with low-melting-point material and a layer with high-melting-point material or a layered structure of a lower layer with higher content of the electroconductive material and an upper layer with lower content of the electroconductive material.

(Insulating Layer)

After the formation of the first electroconductive layer 71 on the first principal surface of the photoelectric conversion section 50, an insulating layer 9 is formed thereon. As previously mentioned, it is preferred that the insulating layer 9 and the protecting layer 5a are the same layer formed in the same step using the same material. In addition, when the insulating layer 9 and the protecting layer 5a are formed in separate steps, materials and formation methods preferably used for the insulating layer 9 are identical to the materials and formation methods previously mentioned for the protecting layer 5a.

When the insulating layer 9 is also formed on a region other than the first electroconductive layer-formed region (collecting electrode-formed region), a material having low optical absorption is preferably used. The insulating layer 9 is formed on the light-receiving side of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, the solar cell can be provided for a practical use without removing the insulating layer after forming the second electroconductive layer. Consequently, the process for manufacturing the solar cell can be simplified, so that productivity can be further improved. When a solar cell is provided for a practical use without removing the insulating layer 9, it is desirable that a material having sufficient weather resistance and stability to heat/humidity in addition to transparency is used for forming the insulating layer 9.

When a material having high chemical stability to a plating solution is used as the insulating layer 9, the insulating layer is hardly dissolved during formation of the second electroconductive layer, so that damage to the surface of the photoelectric conversion section is hindered. When the insulating layer 9 is formed on the first electroconductive layer-non-formed region as well, the insulating layer preferably has high adhesive strength with the photoelectric conversion section 50. For example, in the heterojunction solar cell, the insulating layer 9 preferably has high adhesive strength with the transparent electrode layer 6a on the surface of the photoelectric conversion section 50. By increasing adhesive strength between the transparent electrode layer and the insulating layer, the insulating layer becomes hard to peel off during the formation of the second electroconductive layer, so that deposition of a metal onto the transparent electrode layer 6a can be prevented.

The material of the insulating layer 9 is preferably an inorganic material having a low elongation at break, so that a formation of an opening section, which occurs as the surface shape of the first electroconductive layer changes by stress or the like at the interface, in the annealing treatment is facilitated. Preferable inorganic materials having this property include silicon oxide, silicon nitride, silicon oxynitride, aluminum oxide, sialon (SiAlON), yttrium oxide, magnesium oxide, barium titanate, samarium oxide, barium tantalate, tantalum oxide, and magnesium fluoride. Above all, silicon oxide, silicon nitride, or the like is especially suitably used to adjust the refractive index appropriately. These inorganic materials are not limited to those having a stoichiometric composition, but may be those having oxygen-deficiencies.

In a crystalline silicon-based solar cell, such as heterojunction solar cell or pn-junction crystalline silicon-based solar cell, a textured structure (irregularity structure) is often formed on a surface of the photoelectric conversion section 50, as shown in FIGS. 1 and 9, for light confinement. The insulating layer is preferably formed by the plasma-enhanced CVD method since the film may be formed with sufficient accuracy even at recessed and raised portions of the texture. By using an insulating layer having high density, damage to the transparent electrode layer during a plating treatment can be reduced, and also deposition of a metal onto the transparent electrode layer can be prevented. Thus, the insulating film having high density can function as a barrier layer to water, oxygen, and the like for layers within the photoelectric conversion section 50 (e.g., silicon-based thin-films 3a and 2a), so that an effect of improving long-term reliability of the solar cell can also be expected.

The insulating layer 9 can also contribute to improvement of adhesive strength between the first electroconductive layer 71 and the second electroconductive layer 72. For example, when a Cu layer is formed on an Ag layer as an under-layer electrode by a plating method, adhesive strength between the Ag layer and the Cu layer is low, but it can be expected that the adhesive strength between the first electroconductive layer and the second electroconductive layer is increased to improve the reliability of the solar cell as a result of formation of the Cu layer (second electroconductive layer) on an insulating layer 9 of silicon oxide or the like by an electroplating.

The thickness of the insulating layer 9 may be set appropriately, according to the material of the insulating layer and method of formation thereof. When the first electroconductive layer including the low-melting-point material, the thickness of the insulating layer 9 is preferably so thin that an opening section can be formed in the insulating layer by stress or the like at the interface, which occurs as the surface shape of the first electroconductive layer is changed in the annealing treatment. Accordingly, the thickness of the insulating layer 9 is preferably 1000 nm or less, more preferably 500 nm or less. By appropriately setting the optical characteristics and thickness of the insulating layer 9 in a first electroconductive layer-non-formed region, light reflection characteristics are improved, and the amount of light introduced into the photoelectric conversion section is increased, so that conversion efficiency can be further improved. For obtaining this effect, the refractive index of the insulating layer 9 is preferably lower than the refractive index of the surface of the photoelectric conversion section 50 (e.g., transparent electrode layer 6a). In order to impart suitable antireflection characteristics to the insulating layer 9, the thickness is preferably set within a range of 30 nm to 250 nm, and more preferably set within a range of 50 nm to 250 nm. When the insulating layer 9 is also formed on the first electroconductive layer-non-formed region, the thickness of the insulating layer on the first electroconductive layer-formed region and the thickness of the insulating layer on the first electroconductive layer-non-formed region may be mutually different.

(Annealing Treatment)

After the insulating layer 9 is formed on the first electroconductive layer 71, an opening section 9h is formed in the insulating layer 9 by an annealing treatment (FIG. 11A2). The first electroconductive layer 71 is heated to an annealing temperature Ta that is higher than the thermal-fluidization onset temperature $T_1$ of the low-melting-point in the annealing treatment, so that the low-melting-point material 701 is thermally-fluidized to change the surface shape of the first electroconductive layer 71. In association with this change, the insulating layer 9 formed on the first electroconductive layer 71 is subjected to deformation thereby forming the opening section 9h. The opening section 9h is formed in the form of, for example, cracks. When the opening section 9h is formed in the insulating layer 9, a part of the surface of the first electroconductive layer 71 is exposed to a plating solution for conducting electricity in the electroplating, thus making it possible to deposit a metal on the conducting part as origination point.

The annealing temperature (heating temperature) Ta in the annealing treatment is preferably higher than the thermal-fluidization onset temperature $T_1$ of the low-melting-point material, i.e., $T_1 < Ta$. The annealing temperature Ta more preferably satisfies $T_1+1°\ C. \leq Ta \leq T_1+100°\ C.$, and further preferably satisfies $T_1+5°\ C.\ Ta \leq T_1+60°\ C.$ The annealing temperature can be appropriately set according to the composition and content of the material of the first electroconductive layer, and so on.

As previously mentioned, the annealing temperature Ta is preferably lower than the heat-resistant temperature of the photoelectric conversion section 50. The heat-resistant temperature of the photoelectric conversion section varies depending on the configuration of the photoelectric conversion section. For example, when a transparent electrode layer and an amorphous silicon-based thin-film are provided as in the heterojunction solar cell or the silicon-based thin-film solar cell, the heat-resistant temperature is about 250° C. Thus, in the case of the heterojunction solar cell, the annealing temperature is preferably set at 250° C. or lower so that thermal damage at the amorphous silicon-based thin-film and the interface thereof are suppressed. For achieving a solar cell having higher performance, the annealing temperature is more preferably 200° C. or lower, further preferably 180° C. or lower. In association therewith, the thermal-fluidization onset temperature $T_1$ of the low-melting-point material of the first electroconductive layer 71 is preferably lower than 250° C., more preferably lower than 200° C., further preferably lower than 180° C.

On the other hand, a pn-junction crystalline silicon-based solar cell having a diffusion layer of an opposite conductivity-type on one principal surface of a crystalline silicon substrate of a first conductivity-type has neither an amorphous silicon thin-film nor a transparent electrode layer, and therefore shows a heat-resistant temperature of about 800° C. to 900° C. Thus, the annealing treatment may be performed at an annealing temperature Ta higher than 250° C.

The annealing treatment for forming the opening section 9h in the insulating layer 9 may also serve as a heating treatment for eliminating leakage between the crystalline silicon substrate of the first conductivity-type and the silicon-based layer of the opposite conductivity-type in the insulation-processed region 4a. The process for manufacturing the solar cell can be hereby simplified to improve productivity.

The opening section in the insulating layer for electrically connecting the first electroconductive layer and the second electroconductive layer may be formed by a method other than the aforementioned annealing treatment. For example, the opening section can be formed by laser irradiation, mechanical drilling, chemical etching, or the like, after the formation of the insulating layer on the first electroconductive layer. When the insulating layer is formed using a mask having a shape corresponding to the shape of the first electroconductive layer (pattern shape of the collecting electrode), or by pattern-printing an insulating layer material on the first electroconductive layer-non-formed region, the opening section 9h can be formed in parallel to formation of the insulating layer 9. The opening section 9h can also be formed in parallel to formation of the insulating layer 9 by making the surface irregularity structure of the first electroconductive layer 71 larger than the surface irregularity structure of the photoelectric conversion section, and forming a relatively thin insulating layer on the first electroconductive layer 71. By these methods, the opening section in the insulating layer can be formed even if a material that is free of low-melting-point material is used for the first electroconductive layer 71.

When the insulating layer is formed while the substrate is heated, the opening section can be formed almost simultaneously with formation of the insulating layer. For example, when the insulating layer 9 is deposited on the first electroconductive layer 71 while the substrate is heated to a temperature Tb higher than the thermal-fluidization onset temperature $T_1$ of a low-melting-point material 701 of the first electroconductive layer 71 in formation of the insulating layer 9, an opening section may be formed in the insulating layer, because the insulating layer 9 is deposited on the first electroconductive layer with the low-melting-point material in a fluidized state, and stress is generated at a deposition interface concurrently with deposition.

The substrate temperature Tb during deposition of the insulating layer refers to a substrate surface temperature at the start of deposition of the insulating layer (also referred to as a "substrate heating temperature"). Generally, the mean value of the substrate surface temperature during the deposition of the insulating layer is equal to or higher than the substrate surface temperature at the start of deposition. Therefore, when the insulating layer formation temperature Tb is higher than the thermal-fluidization onset temperature $T_1$ of the low-melting-point material, a deformed portion such as opening section can be formed in the insulating layer.

(Second Electroconductive Layer (Plating Metal Layer))

After the formation of the opening section 9h in the insulating layer 9, the second electroconductive layer 72 is formed by an electroplating method (FIG. 11A at E3). The first electroconductive layer 71 is covered with the insulating layer 9, but in a section where the opening section 9h is formed in the insulating layer 9, the first electroconductive layer 71 is exposed. Therefore, the first electroconductive layer is exposed to plating solution, so that metal can be deposited at the opening section 9h as an origination point. According to this method, a second electroconductive layer matching the shape of the collecting electrode can be formed by an electroplating method without providing a resist material layer having an opening section matching the shape of the collecting electrode.

The second electroconductive layer may be composed of multiple layers. For example, by forming a plating metal layer 72 made of a material having a high electroconductivity, such as Cu, on the first electroconductive layer 71 through the opening section in the insulating layer, and then forming thereon a metal layer excellent in chemical stability, a collecting electrode having low resistance and being excellent in chemical stability can be formed. For example, as described above in connection with the first embodiment, a metal layer of tin or the like may be formed on a metal layer of Cu or the like, which is formed by electroplating, for the purpose of, for example, suppressing isolation and diffusion of the metal and improving adhesion between the collecting electrode and the interconnector.

After the formation of the second electroconductive layer by electroplating, a metal deposited at a part other than at the opening section 9h of the insulating layer 9 as an origination point may be removed by removing a plating solution remaining on the photoelectric conversion section. Examples of the metal deposited at a part other than at the opening section 9h as origination point include those deposited at a pinhole in the insulating layer 9 as an origination point. As a result of removing such an undesirably deposited metal, the shading loss is reduced, so that solar cell characteristics can be further improved.

In this embodiment, the insulating layer 9 may be removed after forming the second electroconductive layer. For example, when a material having large optical absorption is used as the protecting layer 9, the protecting layer is preferably removed for suppressing reduction of solar cell characteristics by the optical absorption of the protecting layer. The protecting layer can be removed by carrying out chemical etching or mechanical polishing. An ashing (incineration) method is also applicable depending on the material.

As long as leakage at the insulation-processed region 4a has been already been eliminated by the heating treatment, the protecting layer 5a on the insulation-processed region 4a may be removed. However, for suppressing ingress of impurities, such as a metal in the collecting electrode, into the silicon substrate from the insulation-processed region due to heating or the like during modularization, it is preferred that the protecting layer 5a on the insulation-processed region 4a is not removed even when the insulating layer is removed. The insulation-processed region is a region that does not directly contribute to power generation, and therefore even when a protecting layer composed of a material having high optical absorption is formed on the insulation-processed region, solar cell characteristics are not significantly deteriorated. When a material having low optical absorption is used for the protecting layer 9, it is not necessary to remove the insulating layer 9.

Although FIG. 11A at E1 to E3 illustrates a configuration in which the groove-shaped insulation-processed region 4a is provided, the second electroconductive layer 72 may be formed on the first electroconductive layer 71 via the opening section 9h of the insulating layer 9 by electroplating in a similar step even when the insulation-processed region (cut surface) 4b generated by cleavage of the silicon substrate is provided as shown in FIG. 11B at F1 to F3.

<Example of Application for Pn-Junction Crystalline Silicon-Based Solar Cell>

The second embodiment of the present invention is also applicable for crystalline silicon-based solar cells (e.g., pn-junction crystalline silicon-based solar cell) other than the heterojunction solar cell. In the pn-junction crystalline silicon-based solar cell, the insulating protecting layer 5a is formed on the insulation-processed region 4a, so that ingress of impurities into the silicon substrate during the heating treatment for eliminating leakage can be suppressed. Since the second electroconductive layer is formed by electroplating after the insulating layer 9 (protecting layer 5a) is formed on the silicon-based layer of the opposite conductivity-type on a surface of the crystalline silicon substrate of the first conductivity-type, ingress of impurities in the plating solution into the silicon substrate can be suppressed.

<Modularization>

As in the case with the first embodiment, the solar cell manufactured by the second embodiment is preferably modularized when put into practical use.

DESCRIPTION OF REFERENCE CHARACTERS 1 crystalline silicon substrate
2a, 2b intrinsic silicon-based thin-film
3a, 3b conductive silicon-based thin-film
3x, 3y conductive silicon-based layer
4a insulation-processed region (groove)
4b insulation-processed region (cut surface)
5a protecting layer (insulating protecting layer)
5b protecting layer
6a, 6b transparent electrode layer
7 collecting electrode
71 metal seed (first electroconductive layer)
711 low-melting-point material
72 plating metal electrode layer (second electroconductive layer)
8 back side metal electrode
9 insulating layer
9h opening section
50 photoelectric conversion section
101, 102 heterojunction solar cell
103 pn-junction crystalline silicon-based solar cell

The invention claimed is:

1. A method of manufacturing a crystalline silicon-based solar cell, the crystalline silicon-based solar cell comprising: a photoelectric conversion section including a crystalline silicon substrate of a first conductivity-type having a first principal surface and a second principal surface, and a silicon-based layer of an opposite conductivity-type on the first principal surface side of the crystalline silicon substrate; and a collecting electrode formed on top of the first principal surface of the photoelectric conversion section, the method comprises:

a photoelectric conversion section providing step of providing the photoelectric conversion section;

a collecting electrode forming step of forming the collecting electrode on the first principal surface of the photoelectric conversion section by an electroplating method;

an insulation process step of applying laser light from the first principal surface side or the second principal surface side of the photoelectric conversion section to the crystalline silicon substrate of the first conductivity-type to form an insulation-processed region where a short-circuit between the first principal surface and the second principal surface of the photoelectric conversion section is eliminated;

a protecting layer forming step of forming a protecting layer on a top surface of the collecting electrode and/or on a surface of the insulation-processed region, the protecting layer being provided for preventing diffusion of a metal, which is contained in the collecting electrode, into the crystalline silicon substrate of the first conductivity-type from the insulation-processed region; and a heating treatment step of heating the insulation-processed region to insulate a surface of the insulation-processed region, thereby eliminating leakage between the crystalline silicon substrate of the first conductivity-type and the silicon-based layer of the opposite conductivity-type, which has been generated by laser processing in the insulation process step, wherein the heating treatment step is performed after the protecting layer forming step.

2. The method of manufacturing a crystalline silicon-based solar cell according to claim 1, wherein in the protecting layer forming step, the protecting layer is formed on the top surface of the collecting electrode.

3. The method of manufacturing a crystalline silicon-based solar cell according to claim 2, wherein the photoelectric conversion section providing step, the collecting electrode forming step, the insulation process step, the protecting layer forming step, and the heating treatment step are performed in this order.

4. The method of manufacturing a crystalline silicon-based solar cell according to claim 2, wherein the photoelectric conversion section providing step, the collecting electrode forming step, the protecting layer forming step, the insulation process step, and the heating treatment step are performed in this order.

5. The method of manufacturing a crystalline silicon-based solar cell according to claim 2, further comprising a metal seed forming step of forming a metal seed on top of the first principal surface of the photoelectric conversion section before the collecting electrode forming step, wherein in the collecting electrode forming step, the collecting electrode is formed on top of the metal seed by the electroplating method.

6. The method of manufacturing a crystalline silicon-based solar cell according to claim 2, wherein the protecting layer consisting of an electroconductive material is formed on the top surface of the collecting electrode in the protecting layer forming step.

7. The method of manufacturing a crystalline silicon-based solar cell according to claim 1, wherein the insulation process step; and a metal seed forming step of forming a metal seed on top of the first principal surface of the photoelectric conversion section are performed before the protecting layer forming step, in the protecting layer forming step, an insulating material layer as the protecting layer is formed on the surface of the insulation-processed region and on top of the metal seed, and in the collecting electrode forming step, the collecting electrode is formed on the metal seed by the electroplating method.

8. The method of manufacturing a crystalline silicon-based solar cell according to claim 7, wherein in the metal seed forming step, a metal seed containing a low-melting-point material is formed, after the protecting layer forming step and before the collecting electrode forming step, an annealing step of forming an opening section in the protecting layer on the metal seed by performing heating so as to cause the low-melting-point material in the metal seed to be thermally-fluidized is performed, and in the collecting electrode forming step, the collecting electrode is formed by the electroplating method with the opening section as an origination point.

9. The method of manufacturing a crystalline silicon-based solar cell according to claim 8, wherein the annealing step also serves as the heating treatment step for eliminating leakage between the crystalline silicon substrate of the first conductivity-type and the silicon-based layer of the opposite conductivity-type.

10. The method of manufacturing a crystalline silicon-based solar cell according to claim 7, wherein the metal seed is formed by applying an electroconductive paste material, and in the heating treatment step, leakage between the crystalline silicon substrate of the first conductivity-type and the silicon-based layer of the opposite conductivity-type is eliminated, and the electroconductive paste material is cured.

11. The method of manufacturing a crystalline silicon-based solar cell according to claim 1, wherein in the collecting electrode forming step, the collecting electrode including copper is formed by the electroplating method.

12. The method of manufacturing a crystalline silicon-based solar cell according to claim 1, wherein in the insulation process step, laser light is applied from the first principal surface side of the photoelectric conversion section to form the insulation-processed region where the silicon-based layer of the opposite conductivity-type of the photoelectric conversion section and the crystalline silicon substrate of the first conductivity-type are removed.

13. The method of manufacturing a crystalline silicon-based solar cell according to claim 1, wherein a heating temperature in the heating treatment step is 150 to 250° C.

14. The method of manufacturing a crystalline silicon-based solar cell according to claim 1, wherein the photoelectric conversion section includes:

a silicon-based thin-film of the opposite conductivity-type as the silicon-based layer of the opposite conductivity-type on the first principal surface side of the crystalline silicon substrate, and a first transparent electrode layer on the silicon-based thin-film of the opposite conductivity-type;

a silicon-based thin-film of the first conductivity-type, and a second transparent electrode layer on the second principal surface side of the crystalline silicon substrate of the first conductivity-type.

15. A method for manufacturing a crystalline silicon-based solar cell module having electrically connected crystalline silicon-based solar cells, the method comprising a step of manufacturing crystalline silicon-based solar cells by the method according to claim 1;

a step of forming a solar cell string by electrically connecting a plurality of the crystalline silicon-based solar cells; and a step of sealing the solar cell string, in this order.

* * * * *

UNITED STATES PATENT AND TRADEMARK OFFICE
CERTIFICATE OF CORRECTION

PATENT NO. : 9,634,176 B2
APPLICATION NO. : 14/893716
DATED : April 25, 2017
INVENTOR(S) : Daisuke Adachi, Masanori Kanematsu and Hisashi Uzu It is certified that error appears in the above-identified patent and that said Letters Patent is hereby corrected as shown below:

On the Title Page

Delete the title page and substitute therefore with the attached title page consisting of the corrected illustrative figure(s).

On the second page in item (57), Abstract:
On Line 3, delete "his" and insert --is-- and;
On Line 6, delete "s" and insert --is--.

In the Drawings

Please replace FIGS. 2A, 2B, 3A, 3B, 4, 5A, 5B, 5C, 6A, 6B, 6C, 7A, 7B, 7C, 8, 11A and 11B with FIGS. 2A, 2B, 3A, 3B, 4, 5A, 5B, 5C, 6A, 6B, 6C, 7A, 7B, 7C, 8, 11A and 11B as shown on the attached pages.

Signed and Sealed this
Twenty-first Day of August, 2018

Andrei Iancu
*Director of the United States Patent and Trademark Office*

(12) United States Patent
Adachi et al.

(10) Patent No.: US 9,634,176 B2
(45) Date of Patent: Apr. 25, 2017

(54) METHOD FOR MANUFACTURING CRYSTALLINE SILICON-BASED SOLAR CELL AND METHOD FOR MANUFACTURING CRYSTALLINE SILICON-BASED SOLAR CELL MODULE

(71) Applicant: KANEKA CORPORATION, Osaka-shi, Osaka (JP)

(72) Inventors: Daisuke Adachi, Settsu (JP); Masanori Kanematsu, Settsu (JP); Hisashi Uzu, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/893,716

(22) PCT Filed: Apr. 1, 2014

(86) PCT No.: PCT/JP2014/059689
§ 371 (c)(1),
(2) Date: Nov. 24, 2015

(87) PCT Pub. No.: WO2014/192408
PCT Pub. Date: Dec. 4, 2014

(65) Prior Publication Data
US 2016/0133779 A1    May 12, 2016

(30) Foreign Application Priority Data
May 29, 2013   (JP) .................. 2013-113526

(51) Int. Cl.
H01L 31/18    (2006.01)
H01L 31/0747  (2012.01)
(Continued)

(52) U.S. Cl.
CPC .... H01L 31/1804 (2013.01); H01L 31/02168 (2013.01); H01L 31/022425 (2013.01);
(Continued)

(58) Field of Classification Search
CPC ............ H01L 31/1804; H01L 31/048; H01L 31/0445; H01L 31/1884; H01L 31/186;
(Continued)

(56) References Cited

U.S. PATENT DOCUMENTS 4,586,988 A   5/1986   Nath et al.
4,989,059 A   1/1991   Micheels et al.
(Continued)

FOREIGN PATENT DOCUMENTS

JP   S6066426 A      4/1985
JP   H09129904 A     5/1997
(Continued)

OTHER PUBLICATIONS

Adachi, D., "Hetero Setsugo Taiyo Denchi no Saikin no Shinten," Hakumaku Taiyo Denchi Seminar, vol. 4, Oct. 18, 2012, 11 pages. (See NPL 2, International Search Report Issued in Application No. PCT/JP2014/059689 for Explanation of Relevance).
(Continued)

*Primary Examiner* — Jerome Jackson, Jr.
*Assistant Examiner* — Bo Fan
(74) *Attorney, Agent, or Firm* — Alleman Hall McCoy Russell & Tuttle LLP

(57) ABSTRACT

A method for manufacturing a crystalline silicon-based solar cell having a photoelectric conversion section includes a silicon-based layer of an opposite conductivity-type on a first principal surface side of a crystalline silicon substrate of a first conductivity-type, and a collecting electrode formed by an electroplating method on a first principal surface of the photoelectric conversion section. By applying laser light
(Continued)

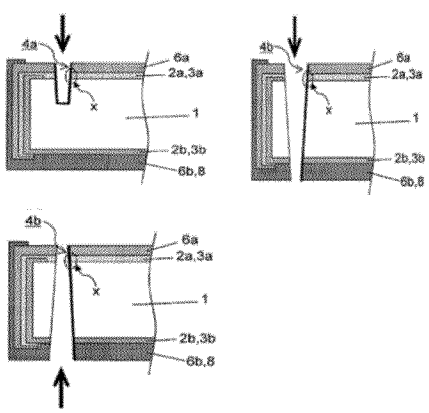

A1

A2

A3

A4

B1

B2

B3

B4

B5

E1

E2

E3

F1

F2

F3